US011411567B2

(12) United States Patent
Moslehi Bajestan et al.

(10) Patent No.: US 11,411,567 B2
(45) Date of Patent: Aug. 9, 2022

(54) PHASE INTERPOLATION-BASED FRACTIONAL-N SAMPLING PHASE-LOCKED LOOP

(71) Applicant: QUALCOMM INCORPORATED, San Diego, CA (US)

(72) Inventors: Masoud Moslehi Bajestan, San Diego, CA (US); Giovanni Marucci, San Diego, CA (US); Dongmin Park, San Diego, CA (US); Marco Zanuso, Encinitas, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/117,240

(22) Filed: Dec. 10, 2020

(65) Prior Publication Data

US 2022/0190833 A1    Jun. 16, 2022

(51) Int. Cl.
  *H03L 7/099*     (2006.01)
  *H03J 7/04*      (2006.01)
  *H03L 7/02*      (2006.01)
  *H03L 7/093*     (2006.01)
  *H03M 3/00*      (2006.01)
  *H03K 3/037*     (2006.01)

(52) U.S. Cl.
  CPC ............. *H03L 7/093* (2013.01); *H03K 3/037* (2013.01); *H03M 3/322* (2013.01)

(58) Field of Classification Search
  CPC ......... H03L 7/093; H03K 3/037; H03M 3/322
  USPC ......................................................... 331/1 R
  See application file for complete search history.

(56) References Cited

U.S. PATENT DOCUMENTS

2009/0325494 A1* 12/2009 Staszewski ........... H04L 27/361
                                                          455/43
2019/0326915 A1* 10/2019 Moslehi Bajestan ... H03L 7/093

* cited by examiner

*Primary Examiner* — Richard Tan
(74) *Attorney, Agent, or Firm* — Smith Tempel Blaha LLC

(57) ABSTRACT

A phase-locked loop (PLL) may include a phase-frequency detector (PFD), a phase interpolation (PI)-based sampler, a loop filter, a voltage-controlled oscillator (VCO), and a fractional frequency divider. The PFD output corresponds to a phase error between a reference clock signal and a feedback signal. The PI-based sampler produces a slope signal in response to the PFD output, and adjusts the slope signal in response to a quantization error correction indication. The PI-based sampler also samples the slope signal. The loop filter produces a VCO control signal in response to a sampled slope signal. The VCO control signal controls the VCO frequency. The fractional frequency divider circuit divides the frequency of the VCO output signal and also determines the quantization error correction corresponding to the quantization error introduced by fractional division of the frequency of the VCO output signal.

30 Claims, 11 Drawing Sheets

PHASE INTERPOLATION-BASED FRACTIONAL-N SAMPLING PHASE-LOCKED LOOP

FIELD

The present disclosure relates to wireless communications and, more particularly, to phase-locked loops (PLLs) in radio frequency (RF) transmitters or receivers.

BACKGROUND

A PLL may be used to synthesize or generate frequencies. For example, an RF receiver or transmitter may use a PLL to synthesize a local oscillator signal in the downconversion or upconversion circuitry that converts signals between radio frequencies and baseband frequencies. One type of PLL, which may be referred to as a sampling or sub-sampling PLL, includes a phase-frequency detector (PFD) and a sampler. The PFD compares the phase and frequency of a reference clock signal with a feedback signal produced by a voltage-controlled oscillator (VCO), and then the voltage variations representing the phase error between the reference clock and feedback signals are sampled. The sampling is based on the charging and discharging of resistive-capacitive (RC) circuitry, controlled by the reference clock signal. A charge pump or a transconductance (Gm) cell then converts the sampled voltage variations into current. The current is provided to a loop filter, and the output of the loop filter is applied to the frequency tuning input of the VCO. The VCO output may be fed back to the PFD through a divide-by-N circuit. The VCO output frequency may be adjusted by adjusting the value of N. A number of frequencies may be generated by adjusting the value of N.

It may be desirable to generate a greater number of frequencies within a frequency band than can be accommodated simply by correspondingly adjusting the value of the integer N. To generate a frequency between two frequencies corresponding to two values of N, the value of N can be modulated or dithered among two or more integers using, for example, a delta-sigma modulator (DSM). Modulating N among two or more integer values over some number of clock cycles results in division by, on average, the desired fractional (i.e., non-integer) number. A challenge presented by such a "fractional-N" PLL is minimizing the adverse effects of quantization error (sometimes referred to as quantization noise) that the modulation of N introduces. One way this challenge has been addressed is by further including a digital-to-time converter (DTC), through which the reference frequency signal is passed before being provided to the PFD, to cancel the quantization error. Challenges presented by the inclusion of a DTC in the reference signal path of a fractional-N PLL include reducing phase noise introduced by the DTC, especially in examples in which the DTC needs to cover a wide dynamic range. One way this challenge has been addressed is by further including a phase interpolator (PI) in the feedback path to relax the DTC's dynamic range requirement and improve DTC phase noise performance. Nevertheless, such a PLL may still suffer from significant phase noise degradation and other disadvantages.

SUMMARY

Various implementations of systems, methods, and apparatuses within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that relative dimensions of elements depicted in the drawing figures may not be to scale.

In one aspect of the disclosure, a PLL may include a phase-frequency detector (PFD), a phase interpolation-based sampler, a loop filter circuit, a voltage-controlled oscillator (VCO), and a fractional frequency divider circuit. The PFD may be configured to produce a PFD output corresponding to a phase error between a reference clock signal and a feedback signal. The phase interpolation-based sampler may be configured to produce a slope signal in response to the PFD output, to adjust the slope signal in response to a quantization error correction indication, and to sample the slope signal. The loop filter circuit may be configured to produce a frequency control signal in response to a sampled slope signal produced by the phase interpolation-based sampler. The VCO may be configured to produce a VCO output signal in response to the frequency control signal. The fractional frequency divider circuit may be configured to divide a frequency of the VCO output signal to produce the feedback signal. The fractional frequency divider circuit also may be configured to determine the quantization error correction indication. The quantization error correction indication may be based on a quantization error introduced by fractional division of the frequency of the VCO output signal.

In another aspect of the disclosure, a PLL may include a PFD, a phase interpolation-based sampler, a transconductance cell, a filter, a VCO, and a fractional frequency divider circuit. The PFD may be configured to produce a PFD output corresponding to a phase error between a reference clock signal and a feedback signal. The phase interpolation-based sampler may be configured to produce a positive slope signal and a negative slope signal in response to the PFD output. The phase interpolation-based sampler also may be configured to set the positive and negative slope signals to a first slope in response to an edge of the feedback signal and to set the positive and negative slope signals to a second slope in response to an edge of a delayed feedback signal. The phase interpolation-based sampler may further be configured to determine the first slope in response to a quantization error correction indication. The phase interpolation-based sampler may yet further be configured to sample the positive and negative slope signals to produce a positive sampled slope signal and a negative sampled slope signal, respectively. The transconductance cell may be configured to produce a current signal in response to a difference between the positive sampled slope signal and the negative sampled slope signal. The filter may be configured to produce a frequency control signal in response to the current signal produced by the transconductance cell. The VCO may be configured to produce a VCO output signal in response to the frequency control signal. The fractional frequency divider circuit may be configured to divide the frequency of the VCO output signal to produce the feedback signal. The fractional frequency divider circuit also may be configured to determine the quantization error correction indication.

Instill another aspect of the disclosure, a method for operating a PLL may include: producing a PFD output corresponding to a phase error between a reference clock signal and a feedback signal; producing a slope signal in response to the PFD output; adjusting the slope signal in response to a quantization error correction indication; sampling the slope signal; filtering a sampled slope signal produced by the phase interpolation-based sampler to produce a frequency control signal; producing a VCO output signal in response to the frequency control signal; fractionally dividing a frequency of the VCO output signal to produce the feedback signal; and determining the quantization error correction indication.

In yet another aspect of the disclosure, a PLL apparatus may include: means for producing a phase-frequency detection output corresponding to a phase error between a reference clock signal and a feedback signal; means for producing a slope signal in response to the phase-frequency detection output; means for adjusting the slope signal in response to a quantization error correction indication; means for sampling the slope signal; means for filtering a sampled slope signal to produce a frequency control signal; means for producing a VCO output signal in response to the frequency control signal; means for fractionally dividing a frequency of the VCO output signal to produce the feedback signal by; and means for determining the quantization error correction indication, wherein the quantization error correction indication is based on a quantization error introduced by the means for fractionally dividing.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described herein may be performed in an order different from that described, and various steps may be added, omitted, or combined. Also, features described with respect to some examples may be combined in other examples.

Figure 1:
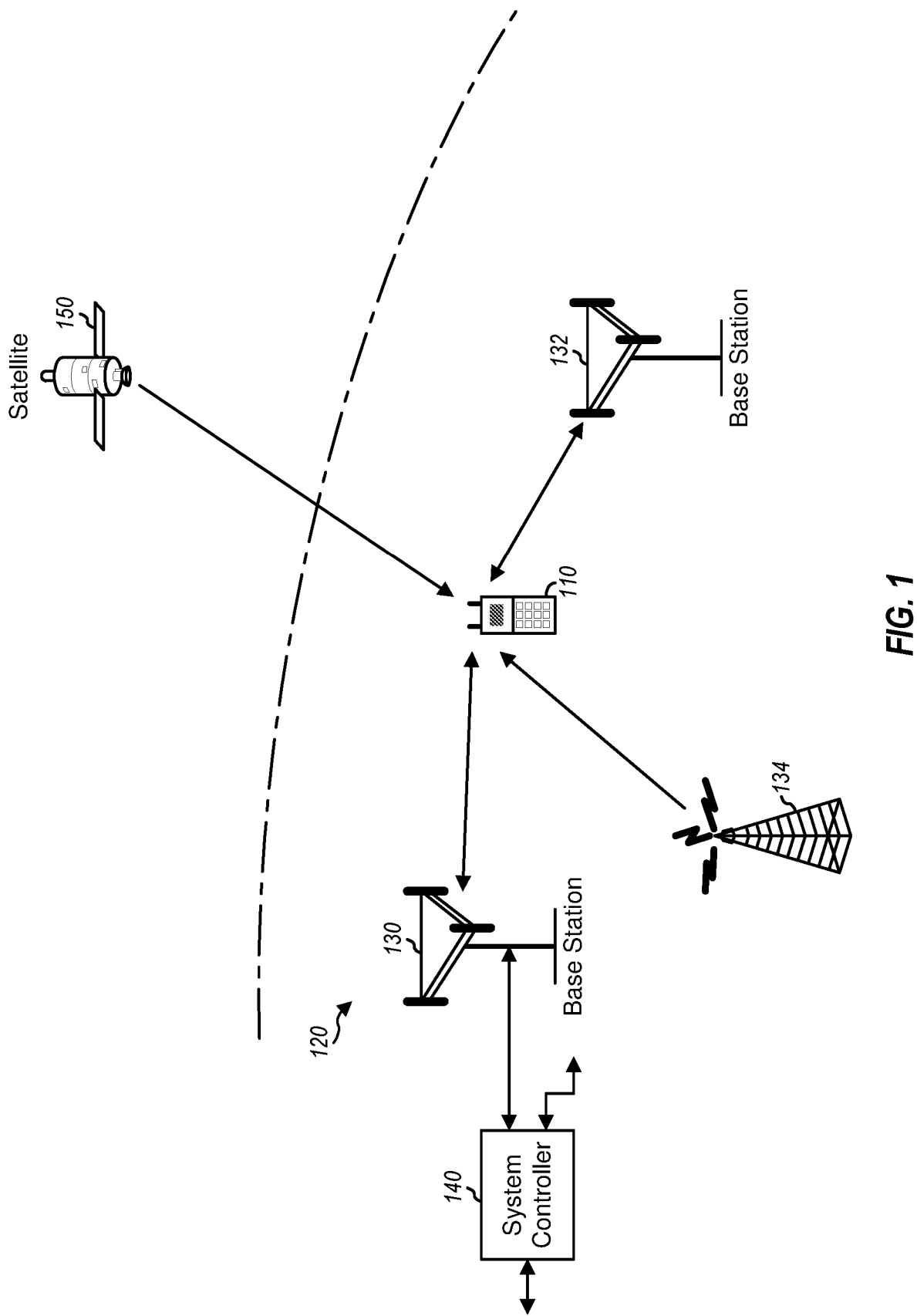
FIG. 1 is a block diagram of a wireless communication system, in accordance with various aspects of the present disclosure.

FIG. 1 illustrates an example of a wireless device 110 operating in a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For clarity, FIG. 1 shows wireless communication system 120 including two base stations 130 and 132 and one system controller 140. More generally, such a wireless communication system may include any number of such base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate bidirectionally with base stations 130 and 132, with one or more access points, and/or with one or more other wireless or mobile devices. Wireless device 110 may receive signals from broadcast stations (e.g., a broadcast station 134). Wireless device 100 may further receive signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, 5G, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies.

Figure 2:
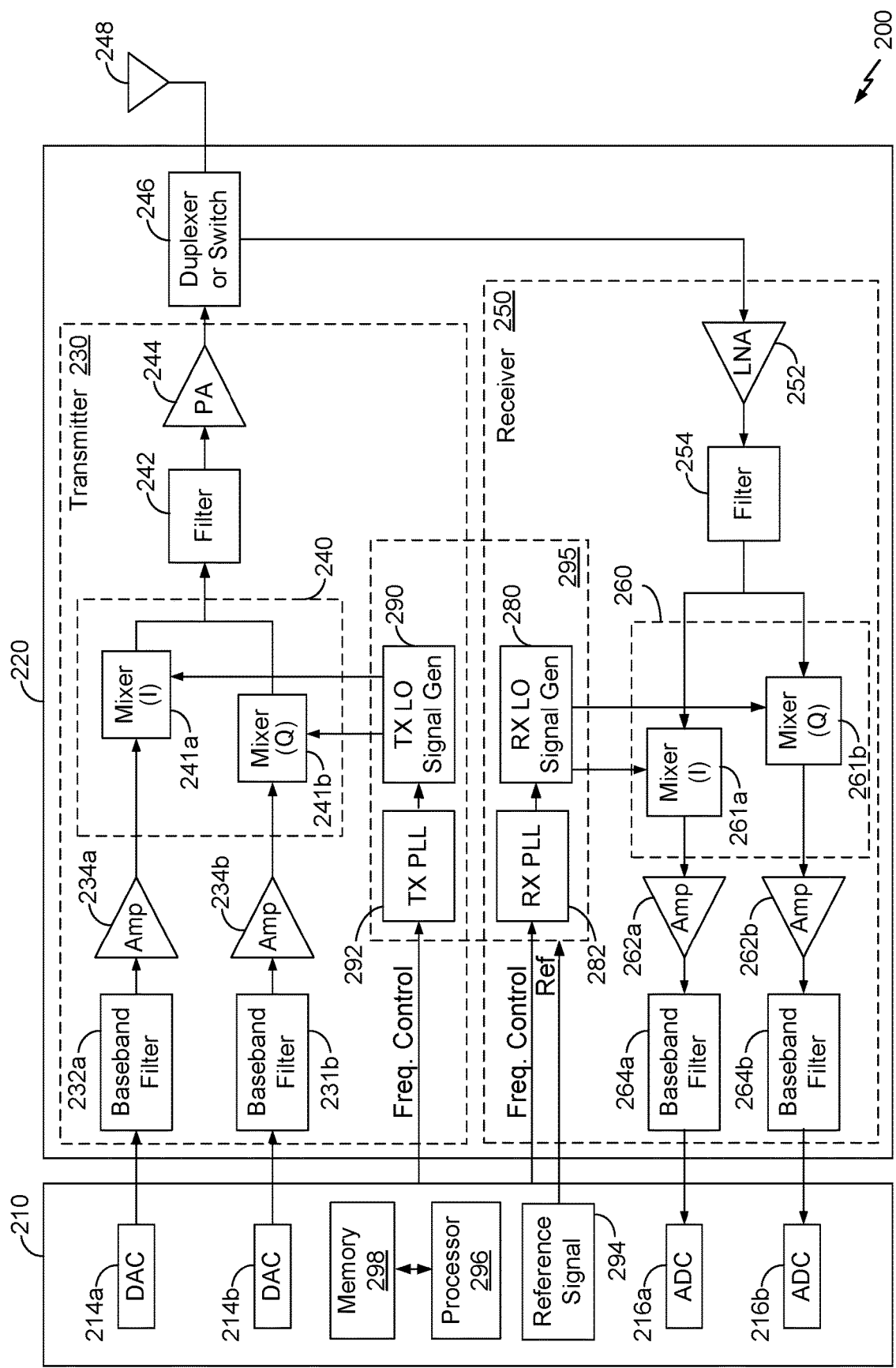
FIG. 2 is a block diagram of transceiver-related portions of a wireless device, in accordance with various aspects of the present disclosure.

FIG. 2 illustrates a wireless device 200 in which exemplary circuits, devices, systems, methods, apparatuses, etc., in accordance with the present disclosure may be embodied or implemented. Wireless device 200 may be an example of above-described wireless device 110 (FIG. 1).

Wireless device 200 may include a transceiver 220 having a transmitter 230 and a receiver 250. In general, the conditioning of the signals in the transmitter 230 and the receiver 250 may be performed by one or more stages of amplifier, filter, upconverter, downconverter, or other circuit blocks. The arrangement or configuration of the circuit blocks shown in FIG. 2 is intended as an example, and the arrangement or configuration of such circuitry may be different in other embodiments. In such other embodiments (not shown) additional circuitry may be included to condition the signals in the transmitter 230 and receiver 250. Likewise, in such other embodiments one or more of the circuit blocks shown in FIG. 2 may be omitted. Also, unless otherwise noted, any signal shown in FIG. 2, or any other figure in the drawings, may be either single-ended or differential.

In the example shown in FIG. 2, wireless device 200 generally comprises the transceiver 220 and a data processor subsystem 210. The data processor subsystem 210 may include a processor 296 operatively coupled to a memory 298. The memory 298 may be configured to store data and program codes, and may generally comprise analog and/or digital processing elements. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor subsystem 210 processes data to be transmitted and provides in-phase (I) and quadrature (Q) analog output signals to the transmitter 230. In an exemplary embodiment, the data processor subsystem 210 includes digital-to-analog-converters (DACs) 214a and 214b for converting digital signals generated by the data processor subsystem 210 into the I and Q analog output signals, e.g., I and Q output currents, for further processing. In other embodiments (not shown), the DACs 214a and 214b may be included in the transceiver 220, and the data processor subsystem 210 may provide data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion. Amplifiers (Amp) 234a and 234b amplify the signals from lowpass filters 232a and 232b, respectively, and provide I and Q baseband signals. An upconverter 240 upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. Depending on various factors, the power amplifier 244 can be configured to operate using one or more driver stages, one or more power amplifier stages, one or more impedance matching networks, and can be configured to provide linearity, efficiency, or a combination of linearity and efficiency. The transmit RF signal is routed through a duplexer or switch 246 and transmitted via an antenna 248. While examples discussed herein utilize I and Q signals, those of skill in the art will understand that elements of the transceiver may be configured to utilize polar modulation.

In the receive path, antenna 248 receives communication signals and provides a received RF signal, which is routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b in a downconverter 260 mix the output of filter 254 with I and Q receive (RX) LO signals from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor subsystem 210. In the exemplary embodiment shown, the data processor subsystem 210 includes analog-to-digital-converters (ADCs) 216a and 216b for converting the analog input signals into digital signals to be further processed by the data processor subsystem 210. In other embodiments (not shown), the ADCs 216a and 216b may be included in the transceiver 220 and provide data to the data processor subsystem 210 digitally.

The TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. The TX LO signal generator 290 generates the TX LO signals based on the output of a TX PLL 292. The RX LO signal generator 280 generates the TX LO signals based on the output of an RX PLL 282. The TX PLL 292 and RX PLL 282 receive frequency control information from the data processor subsystem 210 and a reference (clock) signal from a reference signal generator 294 (which may be in the data processor subsystem 210). Although in the embodiment illustrated in FIG. 2 TX LO signal generator 290 and RX LO signal generator 280 are separate from each other, in other embodiments (not shown) some signal generator circuitry may be shared in combined LO generator circuitry 295, which may provide the TX LO signals and the RX LO signals.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, and the duplexer 246 may be implemented in separate modules or as discrete components, while the remaining elements illustrated in the transceiver 220 may be implemented in a single transceiver chip.

Figure 3:
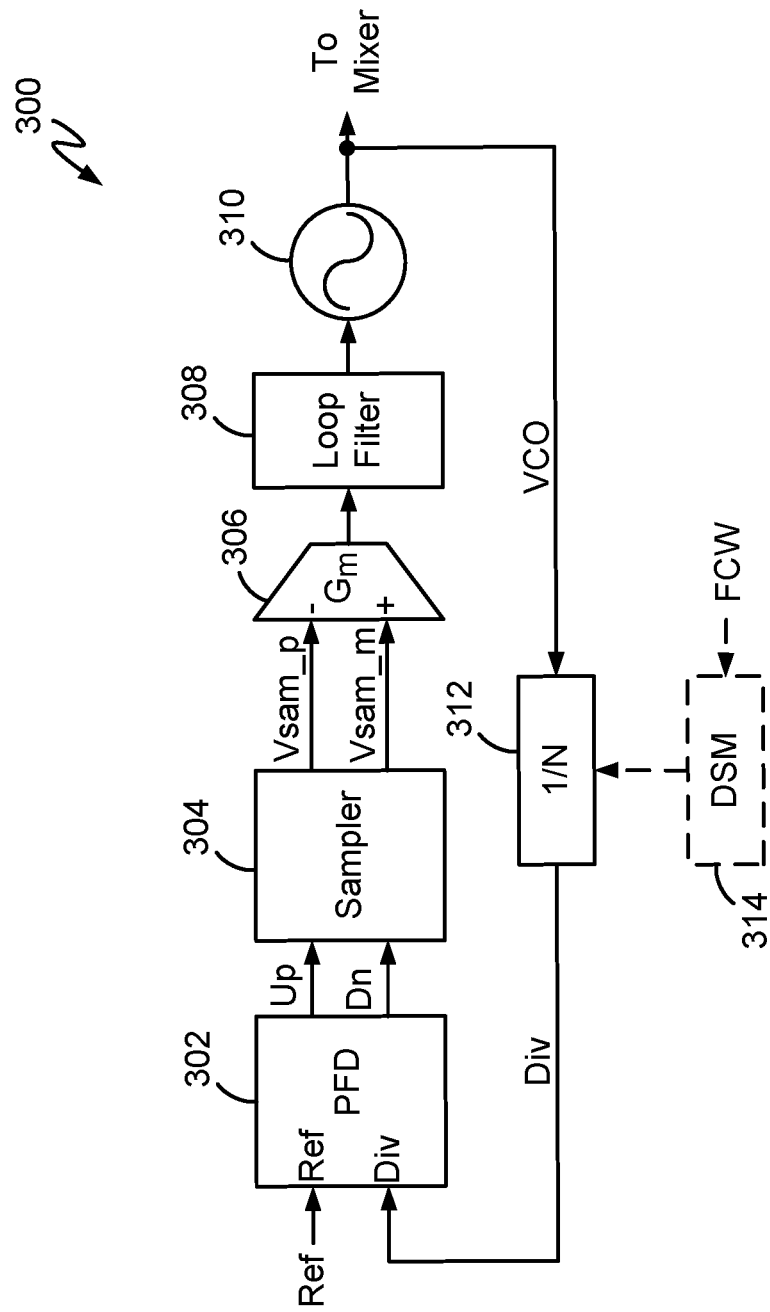
FIG. 3 is a block diagram of a PLL, in accordance with various aspects of the present disclosure.

FIG. 3 illustrates an exemplary phase interpolation-based sampling PLL 300. The PLL 300 may be an example of the TX PLL 292 or RX PLL 282 described above with regard to FIG. 2. The PLL 300 may include a phase-frequency detector (PFD) 302, a sampler 304, a transconductance (Gm) cell 306, a loop filter 308, a VCO 310, and a divide-by-N circuit 312.

The PLL 300 has an "integer-N" topology, meaning that the number of frequencies it can generate based on the reference clock signal is limited to a corresponding number of values of the integer N in the divide-by-N circuit 312. It may be desirable to modify the PLL 300 from its integer-N topology into a "fractional-N" topology, to generate a greater number of frequencies from the reference clock signal than can be generated simply by correspondingly adjusting the value of the integer N in the divide-by-N circuit 312. While it is known that some conventional integer-N PLL topologies can be modified into fractional-N topologies by incorporating a delta-sigma modulator or DSM 314, as suggested by the depiction of the DSM 314 in broken line, the DSM 314 cannot be successfully incorporated into the PLL 300 unless additional features (not shown in FIG. 3) are provided to cancel the quantization error that the DSM 314 would introduce. The following is a description of the structure and operation of the PLL 300 (i.e., absent the DSM 314).

The PFD 302 may be configured to receive a reference clock signal (Ref) from, for example, the reference signal generator 294 (FIG. 2) of a wireless device's data processor subsystem 210. The PFD 302 may be configured to compare the reference clock signal with a feedback signal (Div). In response to the comparison, the PFD 302 produces a PFD output. The PFD output may comprise two or more signals that collectively correspond to or indicate a phase error between the reference clock signal and the feedback signal. For example, the PFD output may comprise one or more "Up" signals and one or more "Down" signals that relate to adjusting the amount and direction of correction that may be applied to drive the phase error toward zero.

The sampler 304 may be configured to produce a slope signal in response to the PFD output. The term "slope" refers to the general exponential character of a signal resulting from the charging or discharging of a resistive-capacitive (RC) circuit (not separately shown in FIG. 3) in the sampler 304. Stated another way, the slope signal may be characterized by an RC time constant. The slope signal may be a differential signal comprising two signals that may be referred to as a positive slope signal and a negative slope signal, one of which results from the charging of an RC circuit, and the other of which results from the discharging of a similar RC circuit. The positive slope signal and negative slope signal may be produced by slope generator circuitry (not separately shown in FIG. 3) in the sampler 304 in response to the PFD output, which may in turn be responsive to successive rising edges of the feedback signal. That is, the respective charging and discharging may be triggered or otherwise enabled by an edge of the feedback signal. It should be noted that the term "slope" as used in this disclosure refers only to the general exponential character of a signal resulting from the charging or discharging of an RC circuit and is not used in a mathematical sense or to quantify any characteristic of the signal. The terms "positive" and "negative" are used only for convenience in distinguishing the differential slope signals from each other, and the terms do not refer to any characteristic of these signals, such as a sign or direction. Nevertheless, it may be noted that in the exemplary embodiments described herein the positive slope signal and negative slope signal essentially mirror each other.

The sampler 304 may include sampling circuitry (not separately shown in FIG. 3) configured to sample the positive slope signal and negative slope signal. The sampler 304 may be configured to obtain a sample (Vsam_p) of the positive slope signal and a sample (Vsam_m) of the negative slope signal. The sampler 304 may be configured to obtain a sample of the positive slope signal and a sample of the negative slope signal in response to the next edge of the reference clock signal following the aforementioned edge of the feedback signal.

The Gm cell 306, which may also be referred to as a transconductance amplifier, may output a current-based signal in response to the voltage difference between Vsam_p and Vsam_m. This Gm cell output signal may be applied to the input of a loop filter 308, which filters the current-based signal and converts it to a voltage. The output of the loop filter 308 is coupled to a frequency control input of the VCO 310. In response to the loop filter output signal, the VCO 310 may adjust the frequency of its output signal ("VCO"), which is also the output of the PLL 300. The divide-by-N circuit 312 may divide the VCO output signal by an integer N to produce the above-described feedback signal.

Figure 4:
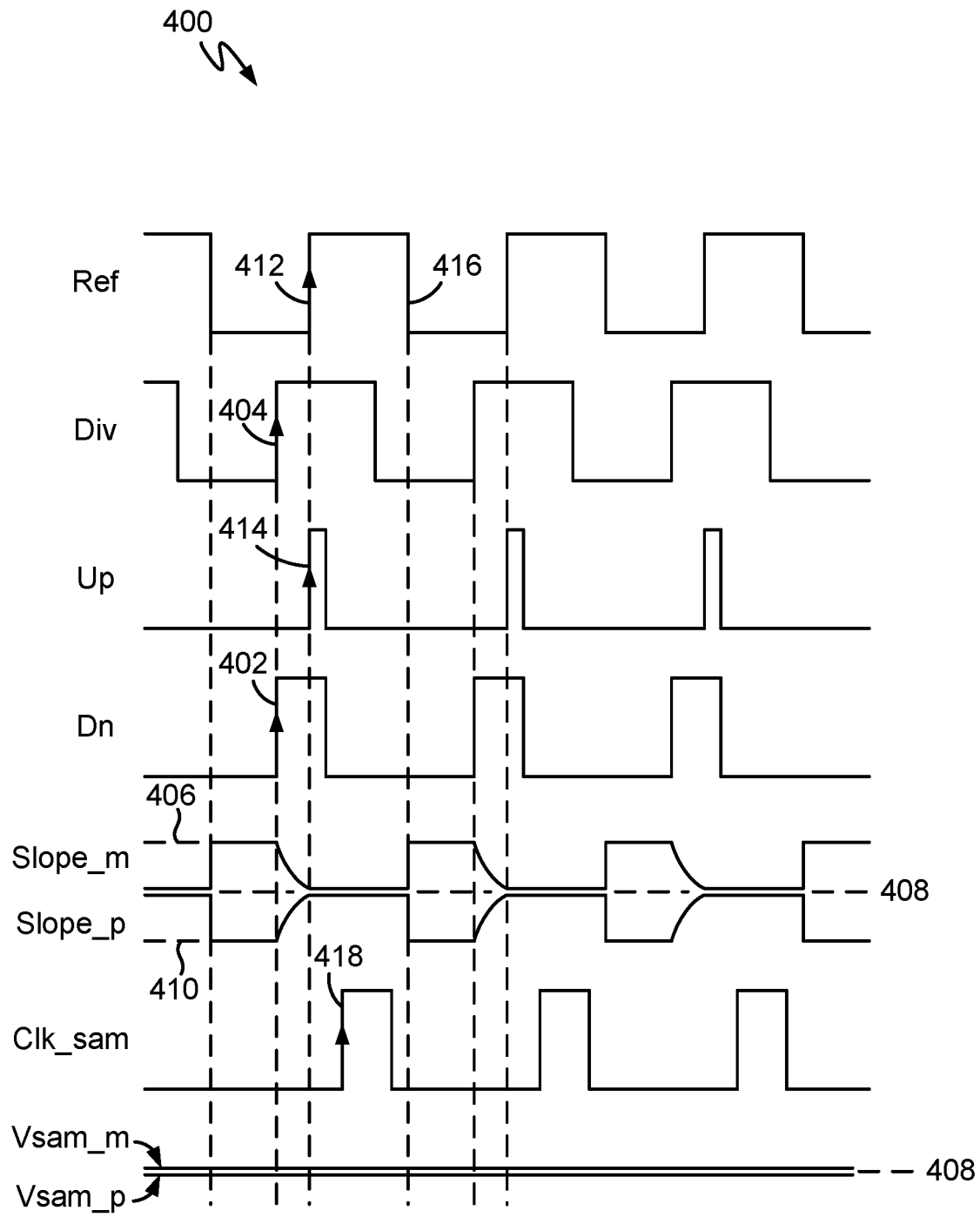
FIG. 4 is a timing diagram illustrating aspects of operation of the PLL of FIG. 3 relating to integer-only frequency division in the feedback loop.

FIG. 4 is a timing diagram 400 illustrating aspects of the operation of the PLL 300 (FIG. 3). The timing diagram 400 illustrates such aspects of the operation of the PLL 300 when the PLL 300 is in a locked or substantially locked state, i.e., when the output of the VCO 310 is tracking the phase of the reference clock signal (Ref). When the PLL 300 is locked, a rising edge 402 of the Down signal is produced, i.e., the Down signal goes high, in response to a rising edge 404 of the feedback signal (Div). In response to the rising edge 402 of the Down signal, the negative slope signal (Slope_m) decreases exponentially from a higher voltage 406 to an intermediate voltage 408 as a result of discharging RC circuitry. Correspondingly, in response to the same rising edge 402 of the Down signal, the positive slope signal (Slope_p) increases exponentially from a lower voltage 410 to the intermediate voltage 408 as a result of charging RC circuitry. Although both the negative slope signal and positive slope signal may reach the same intermediate voltage 408, for purposes of clarity in FIG. 4 the negative slope signal is depicted as slightly higher than the intermediate voltage 408, and the positive slope signal is depicted as slightly lower than the intermediate voltage 408.

The RC time constant is selected so that by the time the next rising edge 412 of the reference clock signal (Ref) occurs the positive slope signal and negative slope signal are substantially equal in magnitude, having reached approximately the same intermediate voltage 408. In response to that next rising edge 412 of the reference clock signal, a rising edge 414 of the Up signal is produced, i.e., the Up signal goes high. In response to both the Up signal and Down signals being high, the slope signal generator circuitry stops the discharging and charging phase.

Before the reference clock signal goes low (edge 416), the negative slope signal and positive slope signal are sampled in response to a rising edge 418 of a sample clock signal (Clk_sam). The rising edge 418 of the sample clock signal may be generated in response to the rising edge 412 of the reference clock signal after some delay. The negative slope signal may be sampled to produce a negative slope sampled signal (Vsam_m), and the positive slope signal may be sampled to produce a positive slope sampled signal (Vsam_p). Following this sampling, the negative slope signal is reset to the higher voltage 406, and the positive slope signal is reset to the lower voltage 410. Although when the PLL 300 is locked (and quantization error is canceled) the negative slope sampled signal and positive slope sampled signal may be equal (i.e., the intermediate voltage 408), for purposes of clarity in FIG. 4 the negative slope sampled signal is depicted as slightly greater than the intermediate voltage 408, and the positive slope sampled signal is depicted as slightly less than the intermediate voltage 408. Although when the PLL 300 is locked (and quantization error is canceled) the voltage differential between the negative slope sampled signal and positive slope sampled signal is zero, to the extent there may be a non-zero voltage differential it is acted upon by the Gm cell 306. Depending on whether such a non-zero voltage differential is positive of negative, the current that the Gm cell 306 outputs causes the loop filter 308 to either increase or decrease the control voltage provided to the VCO 310. Increasing the control voltage may cause the VCO 310 to increase its output signal frequency and thus increase the frequency of the feedback signal (after frequency division by the divide-by-N circuit 312), thereby reducing the amount by which the feedback signal leads the reference signal. Decreasing the control voltage may cause the VCO 310 to decrease its output signal frequency and thus decrease the frequency of the feedback signal (after frequency division by the divide-by-N circuit 312), thereby reducing the amount by which the feedback signal lags the reference signal.

As noted above with regard to FIG. 3, the sampling PLL 300 could be modified into a fractional-N topology by incorporating the DSM 314 and attendant features (not shown in FIG. 3) to cancel the quantization error that the DSM 314 would introduce. The DSM 314 would modulate the integer divisor N. Modulating the integer divisor N generally involves changing the value of N every so many cycles of the reference clock signal so that the average value of N is the desired non-integer number. For example, to divide (on average) by 5.25, N may be set to 6 in association with every fourth reference clock cycle and set to 5 in association with all other reference clock cycles. As a result, every fourth reference clock cycle spans 6 cycles of the VCO output signal, while all other reference clock cycles span 5 cycles of the VCO output signal.

Figure 5:
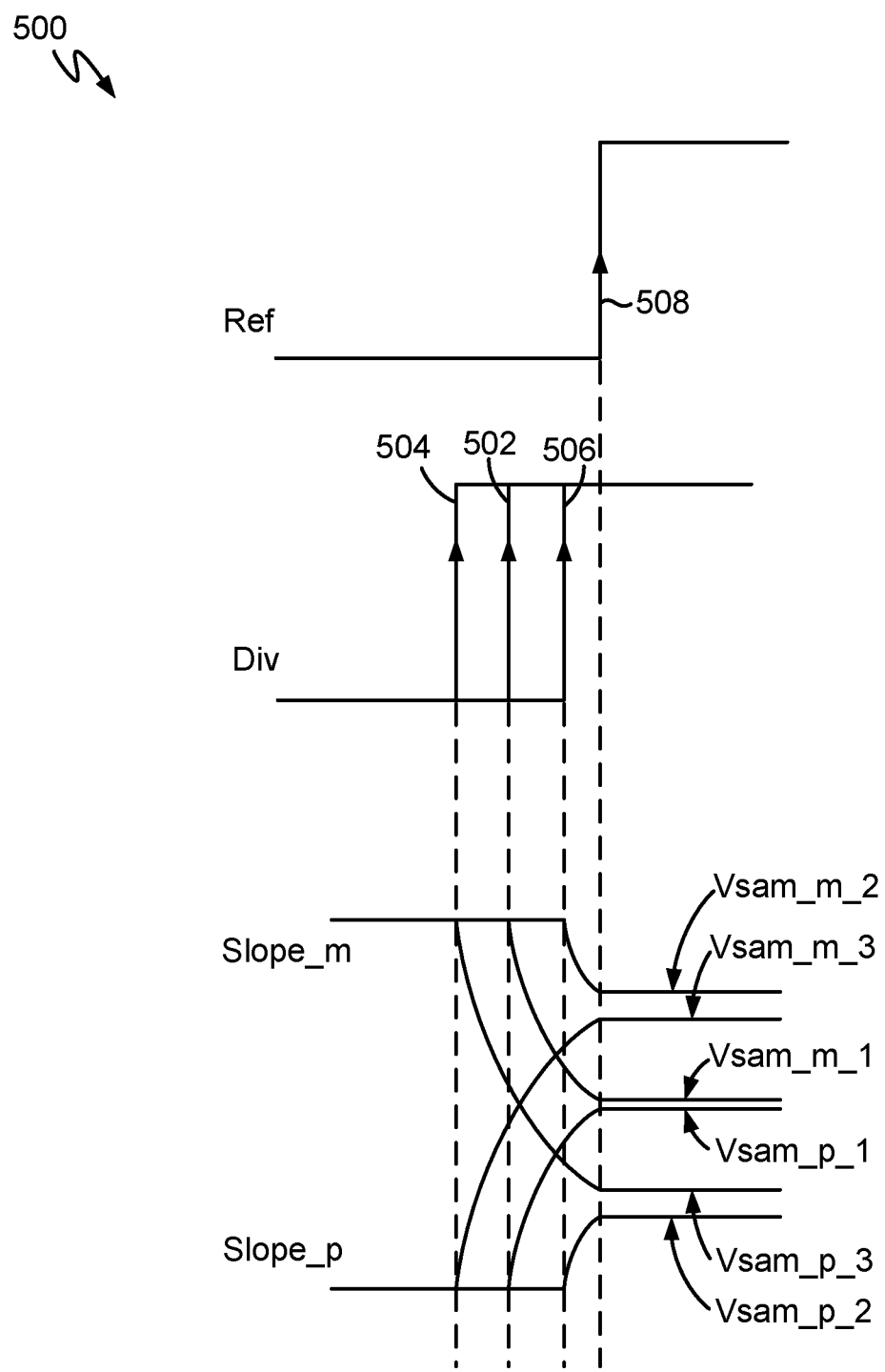
FIG. 5 is a timing diagram illustrating aspects of operation of the PLL of FIG. 3 relating to fractional frequency division in the feedback loop.

FIG. 5 is a timing diagram 500 that illustrates the quantization error (sometimes referred to as quantization noise) problem that would occur if the DSM 314 (FIG. 3) were incorporated into the sampling PLL 300 without also incorporating quantization error cancellation features. The example described above, in which the divisor averages 5.25, is based on modulation of N by a straightforward first-order DSM (essentially an accumulator). In that example (not depicted in FIG. 5), the rising edges of the feedback signal would fluctuate among four values: 0, 0.25*Tvco, 0.5*Tvco, and 0.75*Tvco, where Tvco is the period of the VCO output signal (Tvco). This fluctuation is the instantaneous quantization error or noise. In embodiments in which N is modulated by a higher-order DSM, such as a second-order or third-order multi-state noise shaping (MASH) DSM, various rising edges 502, 504, 506, etc., of the feedback signal (Div) would fluctuate among a greater number of different times relative to rising edges 508 of the reference clock signal, changing from one to another in a more complex manner. More generally, the extent of the fluctuation depends on the DSM order and the frequency control word (FCW). Although the rising edges of the feedback signal could fluctuate among any number of different times relative to rising edges of the reference clock signal depending upon the complexity of the DSM, for clarity only three examples of such rising edges 502, 504, and 506 of the feedback signal are shown in FIG. 5.

On some cycles of the reference clock (Ref), an edge 502 of the feedback signal (Div) will trigger the generation of negative slope and positive slope signals that become equal or substantially equal by the time the rising edge 508 of the reference clock signal and thus the sampling occurs. In such an instance of relative timing between the feedback signal and the reference clock signal, the Gm cell 306 (FIG. 3) responds properly to negative slope sampled signal (Vsam_m_1) and positive slope sampled signal (Vsam_p_1) because the small (or zero) voltage differential between them enables the Gm cell 306 to operate in its linear region. However, a voltage differential between the negative slope sampled signal and positive slope sampled signal that exceeds a threshold may drive the Gm cell 306 into non-linear operation and result in poor PLL performance, possibly including unlocking. In contrast with the edge 502 of the feedback signal that occurs on some cycles of the reference clock signal, edges 504, 506 etc., of the feedback signal that occur on other cycles of the reference clock signal will trigger the generation of negative slope and positive slope signals that do not become equal or substantially equal by the time sampling occurs. In such instances, the relatively large voltage differential between the negative slope sampled signal and positive slope sampled signal (e.g., between Vsam_m_2 and Vsam_p_2, and between Vsam_m_3 and Vsam_p_3) may drive the Gm cell 306 into non-linear operation. An exemplary embodiment of a fractional-N sampling PLL that includes a phase interpolation (PI) feature to cancel the quantization error is described below.

Figure 6:
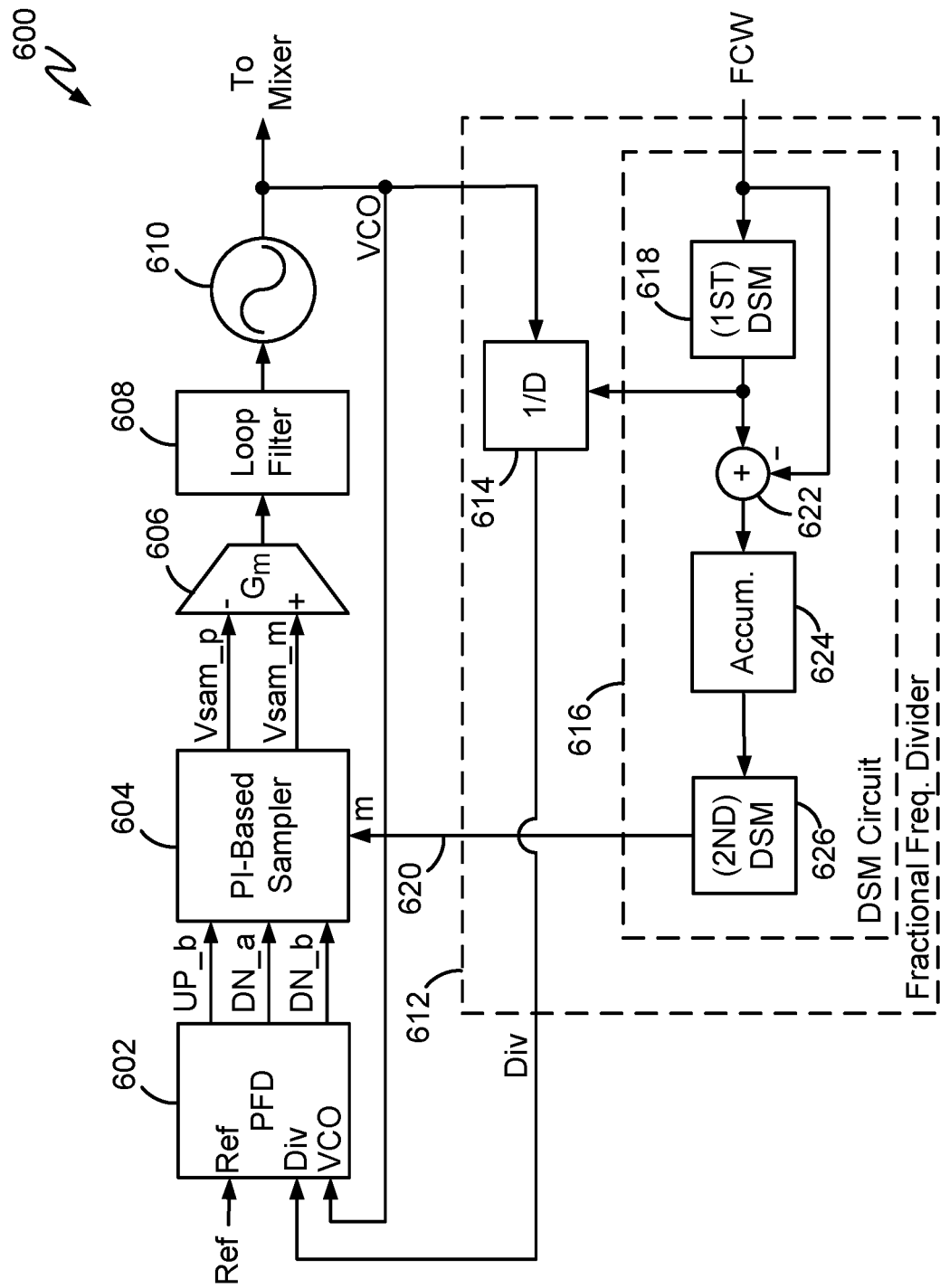
FIG. 6 is a block diagram of a phase interpolation-based, fractional division, sampling PLL, in accordance with various aspects of the present disclosure.

FIG. 6 illustrates an exemplary PI-based "fractional-N" sampling PLL 600. The PLL 600 may be an example of the TX PLL 292 or RX PLL 282 described above with regard to FIG. 2. The exemplary PLL 600 includes a PFD 602, a PI-based sampler 604, a Gm cell 606, a loop filter 608, a VCO 610, and a fractional frequency divider circuit 612.

The PFD 602 may be configured to receive a reference clock signal (Ref) from, for example, the reference signal generator 294 (FIG. 2). The PFD 602 may be configured to compare an input reference clock signal (Ref) with a feedback signal (Div). In response to the comparison, the PFD 602 produces a PFD output comprising an "UP_b" signal, a "DN_a" signal, and a "DN_b" signal. In a manner described in further detail below, the PI-based sampler 604 produces a slope signal in response to the PFD output and samples the slope signal to produce a negative slope sampled signal (Vsam_m) and a positive slope sampled signal (Vsam_p).

The Gm cell 306 is configured to output a current-based signal in response to the voltage difference between Vsam_p and Vsam_m. The output of the Gm cell 306 controls the frequency of the VCO 610. The output of the VCO 610 ("VCO") is provided to the fractional frequency divider circuit 612 as well as to an input of the PFD 602. The PFD 602 is thus configured to receive not only the reference clock signal and the feedback signal but also the VCO output signal.

The fractional frequency divider circuit 612 is configured to divide the VCO output signal frequency by a divisor, which may be non-integer, and provide the resulting feedback signal (Div) to the PFD 602. The divisor is controlled or determined by a frequency control word (FCW) that the fractional frequency divider circuit 612 may receive as an input from, for example, the data processor subsystem 210 (FIG. 2). To accommodate non-integer or fractional division, the fractional frequency divider circuit 612 may include a divide-by-D circuit 614 and a DSM circuit 616. The DSM circuit 616 may include a DSM 618 configured to modulate the integer D in the divide-by-D circuit 614 in response to the frequency control word.

The fractional frequency divider circuit 612 is also configured to produce a quantization error correction indication (m) and provide it to the PI-based sampler via a connection 620. In a manner described below, the PI-based sampler 604 is configured to adjust the slope signal in response to the quantization error correction indication. The slope signal is adjusted based on the quantization error in a way that cancels the effect of the quantization error described above with regard to FIG. 5.

The DSM circuit 616 includes circuitry configured to produce the quantization error correction indication (m), such as a subtractor 622 and an accumulator 624. The subtractor 622 is configured to subtract the frequency control word from the output of the DSM 618. The accumulator 624 integrates the output of the subtractor 622. The result of the integration represents the instantaneous quantization error introduced by the DSM 618. Nevertheless, in this exemplary embodiment the result of the integration is not directly applied to the PI-based sampler 604 due to limited resolution of the PI-based sampler 604 but rather is applied via a second DSM 626. For example, in this exemplary embodiment the PI-based sampler 604 may have a resolution defined by a number of bits that is less than the number of bits in the digital word that results from the integration. This mismatch in bits of resolution would introduce another source of quantization noise. By passing the result of the integration through the second DSM 626, this extra quantization noise is shaped and pushed to higher frequencies where it can be filtered out by the PLL 600. Note that in the same sense that the second DSM 626 shapes the quantization noise introduced by the resolution limitation of the PI-based sampler 604, the (first) DSM 618 shapes the quantization noise introduced by the integer division limitation of the divide-by-D circuit 614.

Figure 7:
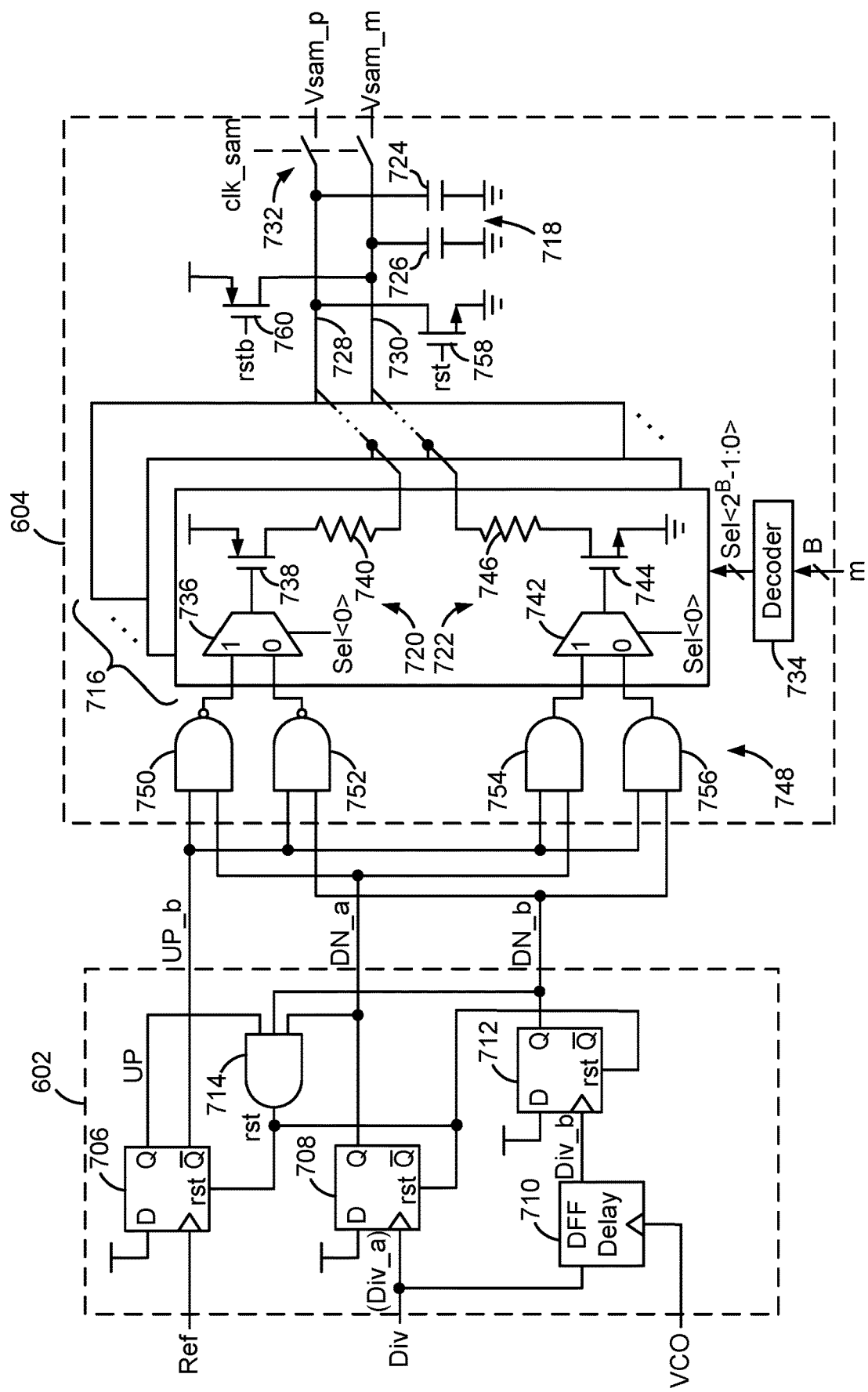
FIG. 7 is a block diagram of phase-frequency detector and phase interpolation-based sampler portions of the PLL of FIG. 6, in accordance with various aspects of the present disclosure.

FIG. 7 illustrates examples of the PFD 602 and the PI-based sampler 604. The exemplary PFD 602 includes a reference signal flip-flop 706, a feedback signal flip-flop 708, and a delay flip-flop chain 710, all of which may comprise D-type flip-flops. The D inputs of the reference signal flip-flop 706 and feedback signal flip-flop 708 are tied to a supply voltage or other voltage that represents a high logic state (i.e., "tied high"). The clock inputs of the reference signal flip-flop 706 and feedback signal flip-flop 708 are configured to receive the reference clock signal (Ref) and the feedback signal (Div), respectively. Accordingly, the reference signal flip-flop 706 transitions from low to high in response to a rising edge of the reference clock signal, and the feedback signal flip-flop 708 transitions from low to high in response to a rising edge of the feedback signal. The signal provided by the Q output of the reference signal flip-flop 706 is analogous to the UP signal described above with regard to FIG. 3. The complement of the UP signal, which may be provided by the Q output of the reference signal flip-flop 706, may be referred to as the UP_b signal.

The signal provided by the Q output of the feedback signal flip-flop 708 may be referred to as the DN_a signal.

In the embodiment illustrated in FIG. 7, two "Down" signals are generated: DN_a and DN_b. Correspondingly, two signals based on the feedback signal are generated: Div_a and Div_b. In relation to generating the DN_a signal as described above, the feedback signal may also be referred to (internally to the PFD 602) as the Div_a signal. The Div_b signal, which is produced by the delay flip-flop chain 710, is essentially a delayed feedback signal, delayed from the Div_a signal by some number of cycles of the VCO output signal. Although depicted for purposes of brevity in FIG. 7 as a single element or block, the delay flip-flop chain 710 may comprise one or more D-type flips flops (DFFs) arranged in a daisy-chain, i.e., with D input of each successive DFF coupled to the Q output of the preceding DFF, and with each DFF clocked by the VCO output signal. The Div_b signal is then provided to the clock input of still another DFF, which may be referred to as the delayed feedback signal flip-flop 712. As the D input of the delayed feedback signal flip-flop 712 is tied high, the delayed feedback signal flip-flop 712 behaves similarly to the above-described reference signal flip-flop 706 and feedback signal flip-flop 708. Thus, whereas the feedback signal flip-flop 708 transitions from low to high in response to a rising edge of the feedback signal (or Div_a signal), the delayed feedback signal flip-flop 712 transitions from low to high in response to a rising edge of the delayed feedback signal (or Div_b signal). The Q output of the delayed feedback signal flip-flop 712 provides the above-referenced DN_b signal. In response to the UP signal, the DN_a signal, and the DN_b signal all being high, a 3-input AND gate 714 produces a reset (rst) pulse that is applied to the reset inputs of the flip-flops 706, 708, and 712.

The number of cycles of the VCO output signal by which the Div_b signal is delayed from the Div_a signal (and correspondingly, the number of DFFS in the delay flip-flop chain 710) may be a function of the order of the DSM 618 (FIG. 6). For example, in an embodiment in which the DSM 618 is a 1st-order DSM, a delay of one period of the VCO output signal (Tvco) may be provided between the Div_a and Div_b signals, and in an embodiment in which the DSM 618 is a 2nd-order MASH DSM (MASH-11), a delay of two times the VCO output signal period (2*Tvco) may be provided between the Div_a and Div_b signals. For higher-order DSMs (i.e., higher than 2nd-order), since the divide ratio is altered over a wider range of integer values, the required dynamic range of the PI-based sampler 604 will be greater. For example, although in an embodiment in which the DSM 618 is a 2nd-order MASH-Il DSM the required dynamic range of the PI-based sampler 604 is 2*Tvco (and correspondingly, the number of DFFs in the delay flip-flop chain 710 may be two), in an embodiment in which the DSM 618 is a 3rd order MASH-DSM (MASH-111) the required dynamic range of the PI-based sampler 604 is 4*Tvco (and correspondingly, the number of DFFs in the delay flip-flop chain 710 may be four).

Although in the exemplary embodiment shown in FIGS. 6-7, the PFD 602 of the PLL 600 includes the reference signal flip-flop 706, the feedback signal flip-flop 708, the delay flip-flop chain 710, and the delayed feedback signal flip-flop 712, in other PLL embodiments (not shown) some of these elements or similar elements may be included in another portion of such a PLL instead of in a PFD. For example, in other PLL embodiments elements similar to the flip-flop chain 710 and delayed feedback signal flip-flop 712 may be omitted from a PFD and instead included in fractional frequency divider circuitry or other circuitry of such a PLL.

In the illustrated embodiment, the PI-based sampler 604 may comprise a plurality of resistance-based unit cells 716, totaling N in number. As all N unit cells may have the same structure as each other, the following description of a unit cell 716 applies to each of the N unit cells 716. The outputs of all N unit cells 716 may be coupled together and coupled to a capacitance circuit 718.

As the slope signal may be a differential signal comprising the positive slope and negative slope signals, each unit cell 716 may correspondingly comprise a first portion 720 and a second portion 722. Similarly, the capacitance circuit 718 may comprise a first capacitance 724 and a second capacitance 726. The outputs of the first portions 720 are coupled together and to the first capacitance 724 at a first output node 728. The outputs of the second portions 722 are coupled together and to the second capacitance 726 at a second output node 730.

In operation, circuitry that is charging in the PI-based sampler 604 produces the positive slope signal at the first output node 728, and circuitry that is discharging produces the negative slope signal at the second output node 730. A switching circuit 732, coupled to the first output node 728 and second output node 730, may be controlled by a sampling clock (clk_sam) to produce the positive slope sampled signal (Vsam_p) and negative slope sampled signal (Vsam_m), respectively. The sampling clock may be produced (by circuitry not shown for purposes of clarity) in response to the reference clock, such as, for example, delayed from the reference clock by a fraction of the reference clock period. Thus, for example, while the sampling clock is high, the switching circuit 732 is closed, resulting in the positive slope sampled signal reflecting the value of the positive slope signal at the first output node 728, and the negative slope sampled signal reflecting the value of the negative slope signal at the second output node 730.

The PI-based sampler 604 is configured to selectively couple a number (0 to N) of the N unit cells 716 together to form circuitry that is charging or discharging. The RC time constant that characterizes the slope signal depends on how many unit cells 716 are included together in the circuit that is charging or discharging (which may also be referred to for convenience as a charging or discharging circuit). The PI-based sampler 604 is configured to couple together in parallel with each other (and thus also together with the capacitance circuit 718) in the charging or discharging circuit a selected number of the N unit cells 716. Note that although the outputs of all N unit cells are fixedly coupled together at the first and second output nodes 728 and 730, only a selected number of the N unit cells 716 participate in the charging or discharging that characterizes the slope signal. The PI-based sampler 604 may be configured to selectively couple unit cells 716 in the following manner.

The PI-based sampler 604 is configured to adjust the slope signal based on the quantization error correction indication and on the signal timing described below. In adjusting the slope signal based on the quantization error correction indication, the number of unit cells 716 that form the charging or discharging circuit may be m, i.e., the value of the quantization error indication. Thus, in adjusting the slope signal the PI-based sampler 604 is configured to couple the m unit cells 716 together in response to the signal timing described below and a selection word or code (Sel) corresponding to the value m.

Each of the N unit cells 716 may be controlled by a corresponding bit of the selection code, which may be encoded as a thermometer code. In adjusting the slope signal, the least-significant bit (LSB) Sel<0> determines whether a first one of the unit cells 716 is to be coupled into the charging or discharging circuit, the next most-significant bit Sel<1> determines whether a second one of the unit cells 716 is to be coupled into the charging or discharging circuit, etc., through the most-significant bit (MSB) Sel<N−1>, which determines whether the Nth one of the units cell 716 is to be coupled into the charging or discharging circuit. The annotation "Sel<$2^B$−1:0>" in FIG. 7 indicates that the selection code consists of bits ranging from an MSB at bit position of $2^B$−1 to an LSB at bit position 0, where "B" is the length of the binary-coded quantization error correction indication (m). A decoder 734 may be configured to convert the quantization error correction indication from a binary-coded value to the thermometer-coded value Sel<$2^B$−1:0>.

The first portions 720 of all N unit cells 716 may collectively be referred to as a positive slope signal generator, and the second portions 722 of all N unit cells 716 may collectively be referred to as a negative slope signal generator. The first portion 720 of each unit cell 716 may comprise a first (2-input) multiplexer 736 or other selector, a switch formed by a first transistor 738, and a first resistance 740. The second portion 722 of each unit cell 716 may comprise a second (2-input) multiplexer 742 or other selector, a switch formed by a second transistor 744, and a second resistance 746. The first resistance 740 is coupled between the drain of the first transistor 738 and the first output node 728. The source of the first transistor 738 is coupled to a supply voltage or other voltage that represents a high logic state. The gate of the first transistor 738 is coupled to the output of the first multiplexer 736. The second resistance 746 is coupled between the drain of the second transistor 744 and the second output node 730. The source of the second transistor 744 is coupled to ground or other voltage potential that represents a low logic state. The gate of the second transistor 744 is coupled to the output of the second multiplexer 742.

In the illustrated embodiment, the first transistor 738 may be a P-channel metal-oxide semiconductor (PMOS) transistor, and the second transistor 744 may be an N-channel MOS or NMOS transistor. Nevertheless, it should be understood that in other embodiments such transistors may be NMOS, PMOS or any other type, and the selection of a transistor type or other switch configuration may depend upon the polarities of the signals controlling the switch in the particular embodiment. More generally, one of ordinary skill in the art will recognize, in view of the teachings in this disclosure, that a positive slope signal generator and negative slope signal generator may be implemented in various ways using various types and configurations of selectors, switches, etc.

The multiplexers 736 and 742 and transistors 738 and 744 in the N unit cells 716, along with some logic 748 (described in further detail below), collectively form selection circuitry that is configured to couple a selected number of unit cells 716 together into charging and discharging circuitry. Based on the signal timing described below, the selection circuitry may couple all N of the unit cells 716 together or only a subset of m unit cells 716. When the signal timing indicates that the slope signal is to be adjusted based on the quantization error correction indication, the selection circuitry may correspondingly adjust the number of unit cells 716 that are coupled together in generating the slope signal.

In the illustrated embodiment, in a selected unit cell 716 the first transistor 738 acts as a closed switch and couples the first resistance 740 between the supply voltage and the first output node 728. Thus the first resistance 740 of a selected unit cell 716 is coupled into, or forms part of, the charging circuit along with the first resistances 740 of all other selected unit cells 716 and the first capacitance 724. Likewise, in a selected unit cell 716 the second transistor 744 acts as a closed switch and couples the second resistance 746 between ground and the second output node 730. Thus the second resistance 746 of a selected unit cell 716 is coupled into, or forms part of, the discharging circuit along with the second resistances 746 of all other selected unit cells 716 and the second capacitance 726.

The first and second resistances 740 and 746 may have the same value, and the first and second capacitances 724 and 726 may have the same value, so that in operation the charging and discharging mirror one another. Thus, in this exemplary embodiment the RC time constant of the charging circuit is equal to the RC time constant of the discharging circuit. The RC time constant of the charging circuit is determined by the selected number of unit cells 716 because the total resistance (R) of the charging circuit is determined by the parallel combination of first resistances 740 of the selected unit cells 716, and the total capacitance (C) is determined by the value of the first capacitance 724. The RC time constant of the discharging circuit is likewise determined by the selected number of unit cells 716 because the total resistance (R) of the discharging circuit is determined by the parallel combination of second resistances 746 of the selected unit cells 716, and the total capacitance (C) is determined by the value of the second capacitance 726.

The slope signal may at times determined by the rising edge of DN_a or the rising edge of DN_b be adjusted based on the selection code. In each unit cell 716 the first multiplexer 736 may at the rising edge of DN_a respond to a corresponding bit of the selection code having a value of "1" by turning the first transistor 738 on (so that it acts as a closed switch), resulting in the first resistance 740 being coupled into the charging circuit. That is, when the selection code has a value of "1", a value of "0" produced by the logic 748 based on the rising edge of DN_a is applied to the gate of the first transistor 738 (i.e., a PMOS switch), thereby turning it on at the rising edge of DN_a. Likewise, in each unit cell 716 the second multiplexer 742 may at the rising edge of DN_a respond to a corresponding bit of the selection code having a value of "1" by turning the second transistor 744 on (so that it acts as a closed switch), resulting in the second resistance 746 being coupled into the discharging circuit. That is, when the selection code has a value of "1", a value of "1" produced by the logic 748 based on the rising edge of DN_a is applied to the gate of the second transistor 744 (i.e., an NMOS switch), thereby turning it on the rising edge of DN_a. Conversely, in each unit cell 716 the first multiplexer 736 may at the rising edge of DN_a respond to a corresponding bit of the selection code having a value of "0" by turning the first transistor 738 off (so that it acts as an open switch), resulting in the first resistance 740 not being coupled into (i.e., being omitted from) the charging circuit at the rising edge of DN_a. Rather, in each unit cell 716 the first multiplexer 736 responds to a corresponding bit of the selection code having a value of "0" by not turning the first transistor 738 on (and thus resulting in the first resistance 740 being coupled into the charging circuit) until the rising edge of DN_b. That is, when the selection code has a value of "0", a value of "0" produced by the logic 748 based on the rising edge of DN_b is applied to the gate of the first transistor 738 (i.e., a PMOS switch), thereby turning it on at the rising edge of DN_b. Likewise, in each unit cell 716 the second multiplexer 742 may at the rising edge of DN_a respond to a corresponding bit of the selection code having a value of "0" by turning the second transistor 744 off, resulting in the second resistance 746 not being coupled into (i.e., being omitted from) the discharging circuit at the rising edge of DN_a. Rather, in each unit cell 716 the second multiplexer 742 responds to a corresponding bit of the selection code having a value of "0" by not turning the second transistor 742 on (and thus resulting in the second resistance 746 being coupled into the discharging circuit) until the rising edge of DN_b. That is, when the selection code has a value of "0", a value of "1" produced by the logic 748 based on the rising edge of DN_b is applied to the gate of the second transistor 744 (i.e., an NMOS switch), thereby turning it on at the rising edge of DN_b.

The logic 748 that generates the signals that the multiplexers 736 and 742 select may comprise a first 2-input NAND gate 750, a second 2-input NAND gate 752, a first 2-input AND gate 754, and a second 2-input AND gate 756. The inputs of the first NAND gate 750 are configured to receive the UP_b and DN_a signals. The inputs of the second NAND gate 752 are configured to receive the UP_b and DN_b signals. The outputs of the first NAND gate 750 and second NAND gate 752 may be coupled to respective inputs of the first multiplexer 736. The first multiplexer 736 may be configured to select one of: a first signal that is the output of the first NAND gate 750 in response to the xth bit of the selection code (Sel) having a value of "1"; and a second signal that is the output of the second NAND gate 752 in response to the xth bit of the selection code having a value of "0" (where x is thermometer code bit index in the range of 0 to N−1 that identifies or corresponds to that unit cell 716). The inputs of the first AND gate 754 are configured to receive the UP_b and DN_a signals. The inputs of the second AND gate 756 are configured to receive the UP_b and DN_b signals. The outputs of the first AND gate 754 and second AND gate 756 may be coupled to respective inputs of the second multiplexer 742. The second multiplexer 742 may be configured to select one of: a third signal that is the output of the first AND gate 754 in response to the xth bit of the selection code having a value of "1"; and a fourth signal that is the output of the second AND gate 756 in response to the xth bit of the selection code having a value of "0."

The number (N) of unit cells 716 in the PI-based sampler 604 may be any number greater than or equal to two. The resolution of the PI-based sampler 604 is proportional to the number N. One of ordinary skill in the art will understand how to select a value of N, and N may be different in different embodiments. In an exemplary embodiment, N may be 64.

Figure 8:
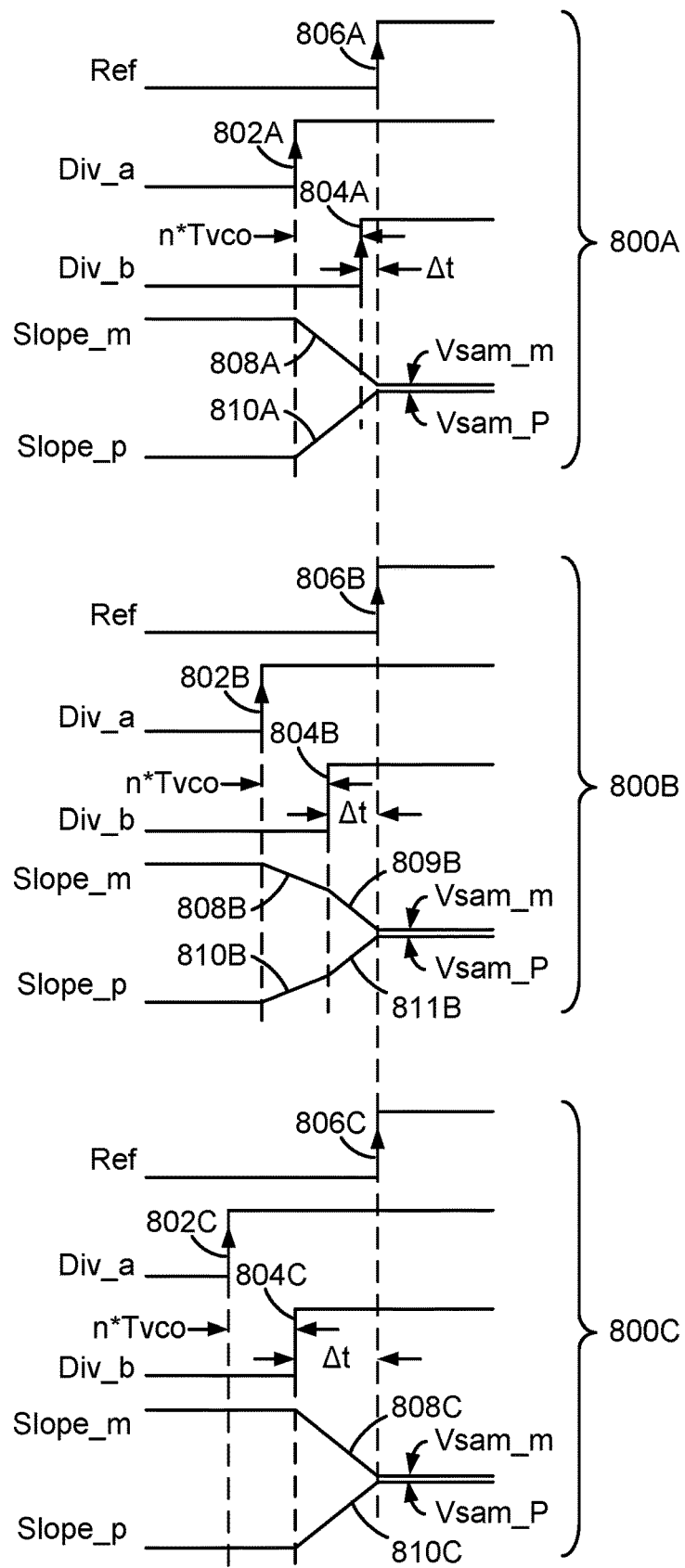
FIG. 8 is a timing diagram illustrating aspects of operation of the PLL of FIG. 6, in accordance with various aspects of the present disclosure.

FIG. 8 illustrates the timing relationships among the reference clock signal (Ref), the Div_a signal, the Div_b signal, the negative slope signal (Slope_m), and the positive slope signal (Slope_p) under three different exemplary circumstances or examples of operation of the PLL 600 (FIGS. 6-7). In each example, the Div_a, Div_b, Slope_m and Slope_p signals may be produced by the PLL 600 in the manner described above with regard to FIGS. 6-7. The three examples differ based upon the amount of instantaneous quantization error introduced by the DSM 618 (FIG. 6). Generally, i.e., in all examples of operation of the PLL 600, in adjusting the slope signal based on the quantization error correction indication (m) the PI-based sampler couples m unit cells 716 together in response to the Div_a signal, and then couples N−m unit cells 716 together in response to the Div_b signal.

As in all examples of operation of the PLL 600, in a first example 800A the time interval between the rising edge 802A of the Div_a signal and the rising edge 804A of the Div_b signal is n*Tvco, where n is a function of the order of the DSM 618, and Tvco is the period of the output signal produced by the VCO 610. A time interval Δt between the rising edge 804A of the Div_b signal and the rising edge 806A of the reference clock signal is the sum of the instantaneous quantization error introduced by the DSM 618 (t_qnoise) and the fixed timing error (t_fixed) determined by the resistances and capacitances. In this first example 800A, the instantaneous quantization error introduced by the DSM 618 (t_qnoise) is smaller than in the other two examples 800B-800C. For example, the instantaneous quantization error may be less than a threshold below which the PLL 600 may operate properly without applying any correction. Accordingly, the DSM circuit 616 produces a quantization error correction indication (m) having a value of N (i.e., the total number of unit cells 716 in the PI-based sampler 604). As illustrated by these examples 800A-800C, the value of m can range from zero to N. Generally, the value of quantization error correction indication (m) produced by the DSM circuit 616 will be inversely related to the amount of instantaneous quantization error introduced by the DSM 618 (and therefore to Δt).

The PI-based sampler 604 adjusts the slope signal based on the quantization error correction indication (m) by setting the slope signal to a first slope in response to the rising edge 802A of the Div_a signal and then setting the slope signal to a second slope in response to the rising edge 804A of the Div_b signal. It should be noted that the terms "first slope" and "second slope" are used for convenience to refer to the effect of a first edge of the feedback signal (Div_a) and a second edge of the feedback signal (i.e., the delayed feedback signal or Div_b), respectively. The terms "first slope" and "second slope" may also be correlated with the first and second RC time constants. As described above with regard to FIGS. 6-7, different numbers of unit cells 716 that are coupled together in a discharging or charging circuit result in different RC time constants. However, in this first example 800A the first slope and second slope are equal because m=N. That is, all N of the unit cells 716 are coupled together in response to the rising edge 802A of the Div_a signal, and thus there are no additional unit cells 716 to couple together in response to the rising edge 804A of the Div_b signal. Note that as the slope signal comprises the Slope_m and Slope_p signals, which mirror each other, the Slope_m and Slope_p signals are both set to the same first slope in response to the rising edge 802A of the Div_a signal and then both set to the same second slope in response to the rising edge 804A of the Div_b signal.

Between the rising edge 802A of the Div_a signal and the rising edge 804A of the Div_b signal, the Slope_m signal has a slope characterized by a discharging circuit having a first RC time constant, and between the rising edge 804A of the Div_b signal and the rising edge 806A of the reference clock signal, the Slope_m signal has a slope characterized by a discharging circuit having a second RC time constant. Likewise, between the rising edge 802A of the Div_a signal and the rising edge 804A of the Div_b signal, the Slope_p signal has a slope characterized by a charging circuit having the first RC time constant, and between the rising edge 804A of the Div_b signal and the rising edge 806A of the reference clock signal, the Slope_p signal has a slope characterized by a charging circuit having the second RC time constant. Nevertheless, in this first example 800A, the first and second RC time constants are equal because the same number of unit cells 716 remain coupled together between the rising edge 802A of the Div_a signal and the rising edge 806A of the reference clock signal. Accordingly, the interval or segment 808A of the Slope_m signal between the rising edge 802A of the Div_a signal and the rising edge 806A of the reference clock signal represents the effect of a discharging circuit having an RC time constant that remains fixed during that interval, and the segment 810A of the Slope_p signal between the rising edge 802A of the Div_a signal and the rising edge 806A of the reference clock signal likewise represents the effect of a charging circuit having an RC time constant that remains fixed during that interval.

Similarly to the first example 800A, in a second example 800B the time interval between the rising edge 802B of the Div_a signal and the rising edge 804B of the Div_b signal is n*Tvco, where n is a function of the order of the DSM 618, and Tvco is the period of the output signal produced by the VCO 610. A time interval Δt between the rising edge 804B of the Div_b signal and the rising edge 806B of the reference clock signal is the sum of the instantaneous quantization error introduced by the DSM 618 (t_qnoise) and the fixed timing error (t_fixed) determined by the resistances and capacitances. In this second example 800B, the instantaneous quantization error introduced by the DSM 618 has some value between zero and n*Tvco. Accordingly, the DSM circuit 616 (FIG. 6) produces a quantization error correction indication (m) having a value greater than zero and less than N.

The PI-based sampler 604 adjusts the slope signal based on the quantization error correction indication (m) by setting the slope signal to a first slope in response to the rising edge 802B of the Div_a signal and then setting the slope signal to a second slope in response to the rising edge 804B of the Div_b signal. In this second example 800B, the number of unit cells 716 that are coupled together in response to the rising edge 802B of the Div_a signal is m (where m is greater than zero), and the additional number of unit cells 716 that are coupled together in response to the rising edge 804B of the Div_b signal is N−m (i.e., the remaining unit cells 716 that had not been coupled together in response to the rising edge 802B of the Div_a signal), resulting in all N unit cells 716 being coupled together.

Between the rising edge 802B of the Div_a signal and the rising edge 804B of the Div_b signal, the Slope_m signal has a first slope characterized by a discharging circuit having a first RC time constant, and between the rising edge 804B of the Div_b signal and the rising edge 806B of the reference clock signal, the Slope_m signal has a second slope characterized by a discharging circuit having a second RC time constant that is different from the first RC time constant. Likewise, between the rising edge 802B of the Div_a signal and the rising edge 804B of the Div_b signal, the Slope_p signal has the first slope, which is characterized by a charging circuit having the first RC time constant, and between the rising edge 804B of the Div_b signal and the rising edge 806B of the reference clock signal, the Slope_p signal has the second slope, which is characterized by a charging circuit having the second RC time constant. The RC time constant changes because the total resistance (R) in the discharging circuit (i.e., the parallel combination of first resistances 746) or charging circuit (i.e., the parallel combination of second resistances 740) changes. Accordingly, the segment 808B of the Slope_m signal between the rising edge 802B of the Div_a signal and the rising edge 804B of the Div_b signal has the first slope, and the segment 809B of the Slope_m signal between the rising edge 804B of the Div_b signal and the rising edge 806B of the reference clock signal has the second slope. Likewise, the segment 810B of the Slope_p signal between the rising edge 802B of the Div_a signal and the rising edge 804B of the Div_b signal has the first slope, and the segment 811B of the Slope_p signal between the rising edge 804B of the Div_b signal and the rising edge 806B of the reference clock signal has the second slope.

Similarly to the above-described first and second examples 800A and 800B, in a third example 800C the time interval between the rising edge 802C of the Div_a signal and the rising edge 804C of the Div_b signal is n*Tvco, where n is a function of the order of the DSM 618, and Tvco is the period of the output signal produced by the VCO 610. A time interval Δt between the rising edge 804C of the Div_b signal and the rising edge 806A of the reference clock signal is the sum of the instantaneous quantization error introduced by the DSM 618 (t_qnoise) and the fixed timing error (t_fixed) determined by the resistances and capacitances. In this third example 800C, the instantaneous quantization error introduced by the DSM 618 is a maximum. Accordingly, the DSM circuit 616 (FIG. 6) produces a quantization error correction indication (m) having a value of zero.

Similarly to the above-described examples 800A and 800B, the PI-based sampler 604 adjusts the slope signal based on the quantization error correction indication (m) by setting the slope signal to a first slope in response to the rising edge 802C of the Div_a signal and then setting the slope signal to a second slope in response to the rising edge 804C of the Div_b signal. As m=0 in this example, the first slope is zero. No unit cells 716 are coupled together to form charging and discharging circuits in response to the rising edge 802C of the Div_a signal. Rather, all N unit cells 716 are coupled together to form a charging circuit and a discharging circuit in response to the rising edge 804C of the Div_b signal. Accordingly, the interval or segment 808C of the Slope_m signal between the rising edge 802C of the Div_a signal and the rising edge 806C of the reference clock signal represents the effect of a discharging circuit having an RC time constant that remains fixed during that interval, and the interval or segment 810C of the Slope_p signal between the rising edge 802C of the Div_a signal and the rising edge 806C of the reference clock signal represents the effect of a charging circuit having an RC time constant that remains fixed during that interval.

Note that in all three examples 800A-800C the negative slope sampled signal (Vsam_m) and the positive slope sampled signal (Vsam_p) would have the same ("intermediate") value as each other (i.e., remain constant) when the PLL 600 is locked and the quantization error is being canceled. Nevertheless, for purposes of clarity in FIG. 8 the negative slope sampled signal is depicted as slightly greater than this intermediate value, and the positive slope sampled signal is depicted as slightly less than this intermediate value. The negative slope signal (Slope_m) and the positive slope signal (Slope_p) reach or substantially reach the intermediate value by the time sampling occurs because they approach this intermediate value in accordance with an RC time constant that is, in effect, an interpolation between two RC time constants. The values of R and C (i.e., resistances 740 and 746 and capacitances 724 and 726 in FIG. 7) may be chosen such that the product of R*C*Ln(2) is slightly larger than n*Tvco to make sure the rising edge of Div_b always happens before the rising edge of the reference clock signal in the locked condition.

Figure 9:
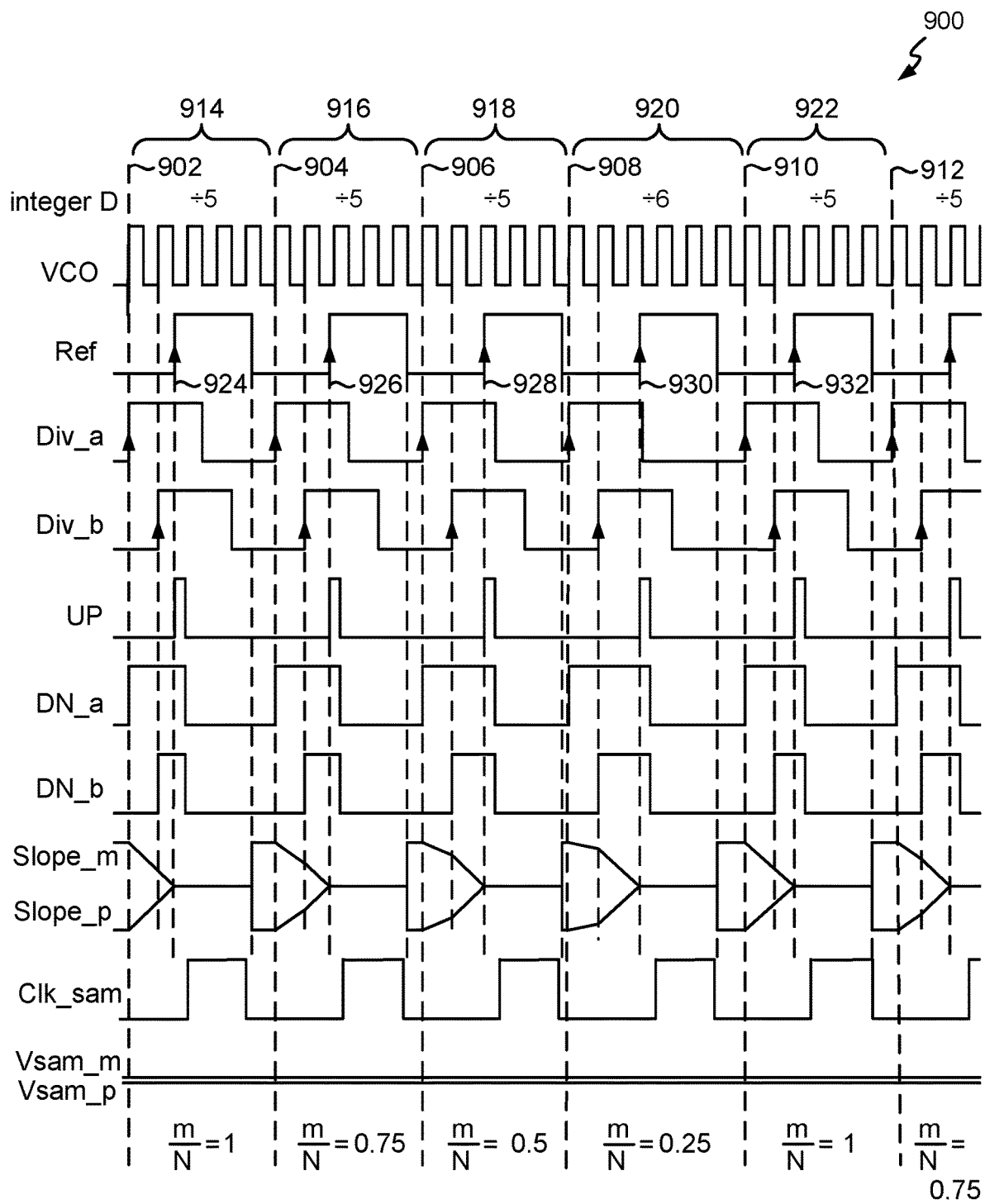
FIG. 9 is another timing diagram illustrating aspects of operation of the PLL of FIG. 6, in accordance with various aspects of the present disclosure.

FIG. 9 is a timing diagram 900 illustrating an example of operation of the PLL 600 (FIGS. 6-7) in which the divisor in the divide-by-D circuit 614 averages 5.25 based on modulation of the integer D by a first-order DSM 618.

To achieve an average divisor of 5.25, the DSM 618 dithers the integer D in the divide-by-D circuit 614 between 5 and 6. On every fourth division that the divide-by-D circuit 614 performs, the DSM 618 changes D from 5 to 6; on all other divisions the divide-by-D circuit 614 performs, the DSM 618 maintains D at 5. The result of each division is one cycle of the Div_a signal. Successive rising edges of the Div_a signal thus occur at times 902, 904, 906, 908, 910 and 912. Correspondingly, divisions by 5 ("+5") occur in, for example, a time interval 914 between times 902 and 904, a time interval 916 between times 904 and 906, and a time interval 918 between times 906 and 908. Division by 5 means that every 5 cycles of the VCO output signal (VCO) the divide-by-D circuit 614 produces one cycle of the Div_a signal. Similarly, a division by 6 ("+6") occurs in, for example, a time interval 920 between times 908 and 910. Division by 6 means that every 6 cycles of the VCO output signal (VCO) the divide-by-D circuit 614 produces one cycle of the Div_a signal. As described above with regard to the PFD 602 shown in FIG. 7, the Div_b signal is the same as the Div_a signal but delayed from the Div_a signal by n*Tvco, where Tvco is the period of the VCO output signal, and n is the order of the DSM 618, which in this example is 1.

A first-order DSM 618 is used in this example because the resulting periodicity, i.e., dithering the integer D between only two values, is readily illustrated. Nevertheless, a higher-order DSM 618 may be advantageous because the periodicity may undesirably introduce another source of error. A second-order MASH-II DSM 618 would dither the integer D over a wider range of values, and a third-order MASH 111 DSM 618 would dither the integer D over a still wider range of values.

In the time interval 914 the instantaneous quantization error, which is the time interval between the rising edge of the Div_b signal and the rising edge of the reference clock signal (Ref), is a minimum. That is, the instantaneous quantization error in the time interval 916 that follows the time interval 914 is greater than the instantaneous quantization error in the time interval 914; the instantaneous quantization error in the time interval 918 that follows the time interval 916 is greater than the instantaneous quantization error in the time interval 916; and the instantaneous quantization error in the time interval 920 that follows the time interval 918 is greater than the instantaneous quantization error in the time interval 918. In the time interval 922 that follows the time interval 920 the instantaneous quantization error returns to the minimum. In the illustrated example, this periodic pattern of the instantaneous quantization error cumulatively increasing from a minimum value over four successive divisions before returning to the minimum value occurs repeatedly so long as the PLL 600 is operating and remains locked.

When the instantaneous quantization error is a minimum, the DSM circuit 616 produces a quantization error correction indication (m) having a value of N (i.e., the total number of unit cells 716). Based on the quantization error correction indication (m) having a value of N, the PI-based sampler 604 selects all N unit cells 716 in response to the rising edge of the Div_a signal.

As described above with regard to FIG. 7, a unit cell 716 that is to be selected in response to the rising edge of the Div_a signal is provided with a bit of the selection code having a value of "1". The first multiplexer 736 in such a selected unit cell 716 (FIG. 7) couples the output of the NAND gate 750 to the gate of the first transistor 738. The NAND gate 750 produces a signal (not shown in FIG. 9) that is low between the rising edge of the Div_a signal and the rising edge of the reference clock signal and high at other times. In an embodiment in which the first transistor 738 is PMOS, the low output of the NAND gate 750 is passed through the first multiplexer 736 and turns the first transistor 738 on, thereby coupling the first resistance 740 into a charging circuit together with all other first resistances 740 of selected unit cells 716 and the capacitance 724. Similarly, the second multiplexer 742 in a unit cell 716 that is to be selected in response to the rising edge of the Div_a signal (i.e., provided with a bit of the selection code having a value of "1") couples the output of the AND gate 754 to the gate of the second transistor 744. The AND gate 754 produces a signal (not shown in FIG. 9) that is high between the rising edge of the Div_a signal and the rising edge of the reference clock signal and low at other times. In an embodiment in which the second transistor 744 is NMOS, the high output of the AND gate 754 is passed through the second multiplexer 742 and turns the second transistor 744 on, thereby coupling the second resistance 746 into a discharging circuit together with all other second resistances 746 of selected unit cells 716 and the capacitance 726.

As a result of the discharging and charging beginning at the rising edge of the Div_a signal, the Slope_m and Slope_p signals exponentially approach and ultimately reach or substantially reach an intermediate value by the time the rising edge of the reference clock signal occurs at a time 924. The Slope_m and Slope_p signals are sampled when the sampling clock (Clk_sam) is high, resulting in the negative slope sampled signal (Vsam_m) and positive slope sampled signal (Vsam_p). Also, following sampling a reset signal (not shown) is generated when both the reference clock and Div_a signals are low. The reset signal turns two transistors 758 and 760 on, which couple the first and second capacitors 724 and 726 to ground and the power supply voltage, respectively, to discharge and re-charge the first and second capacitors 724 and 726, respectively, in preparation for the next charging and discharging cycle.

The instantaneous quantization error in the time interval 916 that follows the time interval 914 is greater than the minimum (or greater than substantially zero). When the instantaneous quantization error is greater than the minimum, the DSM circuit 616 produces a quantization error correction indication (m) having a value less than N (i.e., less than the total number of unit cells 716). When the quantization error correction indication (m) has such a value, the PI-based sampler 604 selects only m out of the N unit cells 716 in response to the rising edge of the Div_a signal and further selects the remaining N−m unit cells in response to the rising edge of the Div_b signal.

When fewer than all N unit cells 716 are selected in response to the rising edge of the Div_a signal, such as in the time interval 916, the discharging and charging that begins at the rising edge of the Div_a signal results in the Slope_m and Slope_p signals being characterized by a first slope between the rising edge of the Div_a and the rising edge of the Div_b signal because only m out of the N unit cells are selected during that time, and characterized by a second slope (different from the first slope) between the rising edge of the Div_b signal and the rising edge of the reference clock signal because all N unit cells are selected during that time. The N−m unit cells 716 that are not selected in response to the rising edge of the Div_a signal become additionally or further selected in response to the rising edge of the Div_b signal (i.e., in addition to the unit cells 716 that are selected in response to the rising edge of the Div_a signal) in the following manner.

The first multiplexer 736 in a unit cell 716 that is not to be selected in response to the rising edge of the Div_a signal but rather only to be additionally selected in response to the rising edge of the Div_b signal (i.e., provided with a bit of the selection code having a value of "0") couples the output of the NAND gate 752 to the gate of the first transistor 738. The NAND gate 752 produces a signal (not shown in FIG. 9) that is low between the rising edge of the Div_b signal and the rising edge of the reference clock signal and high at other times. In an embodiment in which the first transistor 738 is PMOS, the low output of the NAND gate 752 is passed through the first multiplexer 736 and turns the first transistor 738 on, thereby coupling the first resistance 740 into a charging circuit together with all other first resistances 740 of selected unit cells 716 and the capacitance 724. Similarly, the second multiplexer 742 in a unit cell 716 that is not to be selected in response to the rising edge of the Div_a signal but rather only to be additionally selected in response to the rising edge of the Div_b signal (i.e., provided with a bit of the selection code having a value of "0") couples the output of the AND gate 756 to the gate of the second transistor 744. The AND gate 756 produces a signal (not shown in FIG. 9) that is high between the rising edge of the Div_b signal and the rising edge of the reference clock signal and low at other times. In an embodiment in which the second transistor 744 is NMOS, the high output of the AND gate 756 is passed through the second multiplexer 742 and turns the second transistor 744 on, thereby coupling the second resistance 746 into a discharging circuit together with all other second resistances 746 of selected unit cells 716 and the capacitance 726.

As a result of the discharging and charging beginning at the rising edge of the Div_a signal based on a first slope and continuing after the rising edge of the Div_b signal based on a second slope, the Slope_m and Slope_p signals exponentially approach and ultimately reach or substantially reach the intermediate value by the time the rising edge of the reference clock signal occurs at a time 926. The Slope_m and Slope_p signals are sampled when the sample clock (Clk_sam) is high, resulting in the negative slope sampled signal (Vsam_m) and positive slope sampled signal (Vsam_p).

Fewer unit cells 716 are selected in response to the rising edge of the Div_a signal in the time interval 916 than are selected in response to the rising edge of the Div_a signal in the time interval 914 because the instantaneous quantization error is greater in the time interval 916 than in the time interval 914. That is, the value of m is smaller in the time interval 916 than in the time interval 914. Fewer unit cells 716 are selected in response to the rising edge of the Div_a signal in the time interval 918 than are selected in response to the rising edge of the Div_a signal in the time interval 916 because the instantaneous quantization error is greater in the time interval 918 than in the time interval 916. That is, the value of m is smaller in the time interval 918 than in the time interval 916. Fewer unit cells 716 are selected in response to the rising edge of the Div_a signal in the time interval 920 than are selected in response to the rising edge of the Div_a signal in the time interval 918 because the instantaneous quantization error is greater in the time interval 920 than in the time interval 918. That is, the value of m is smaller in the time interval 920 than in the time interval 918. The ratio (m/N) between the number of unit cells 716 that are selected in response to the rising edge of the Div_a signal and the total number (N) of unit cells 716 is one (1) in the time interval 914, 0.75 in the time interval 916, 0.5 in the time interval 918, 0.25 in the time interval 920, and following the above-described pattern in this example returns to one (1) in the time interval 922. Note that the intermediate value, i.e., the value of the negative slope sampled signal (Vsam_m) and positive slope sampled signal (Vsam_p), remains constant over all time intervals 914, 916, 918, 920, 922, etc., as a result of the phase interpolation feature tracking and canceling the changing instantaneous quantization error.

Figure 10:
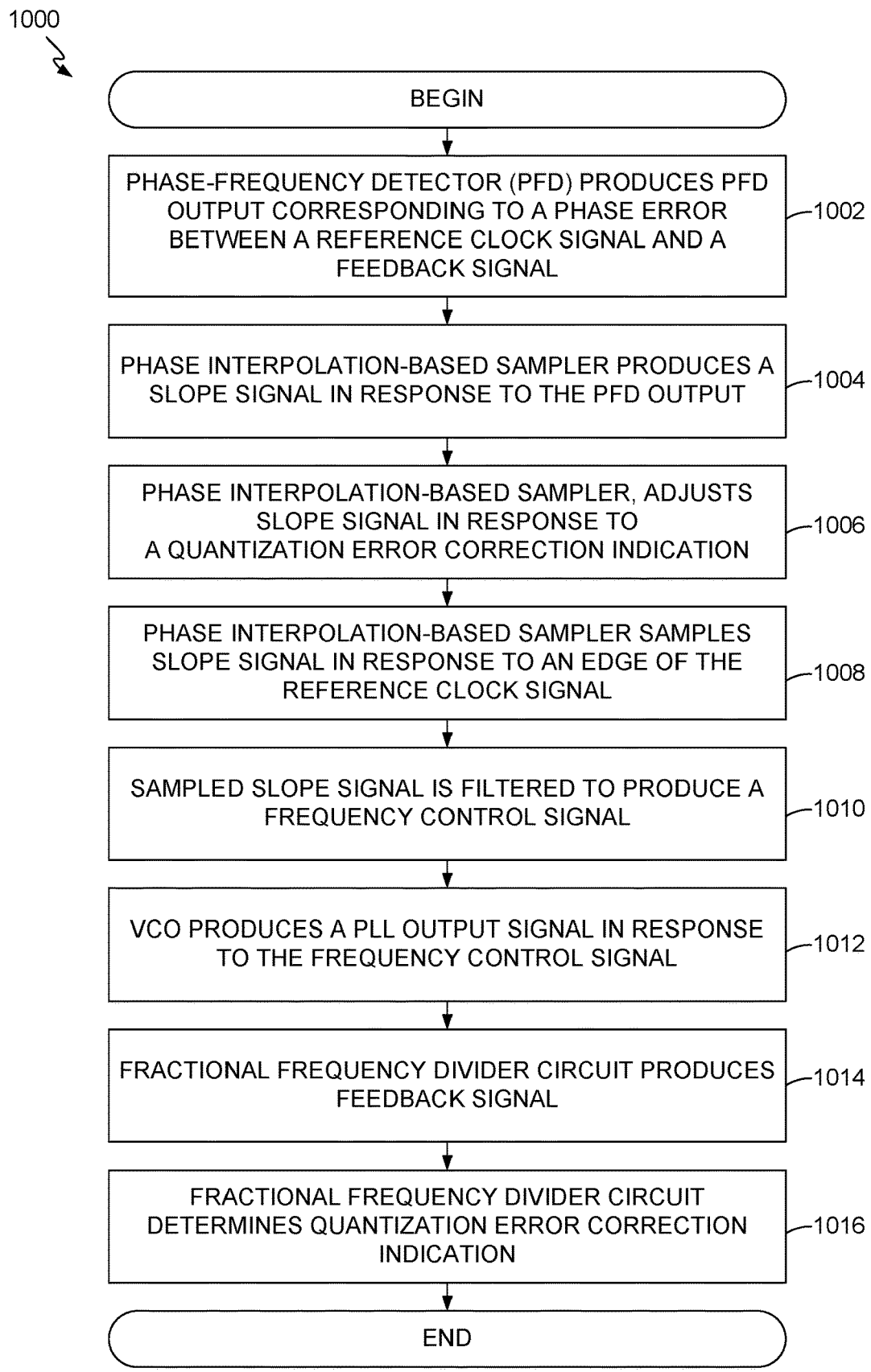
FIG. 10 is a flow diagram illustrating a method for operating a PLL, in accordance with various aspects of the present disclosure.

FIG. 10 is a flow diagram illustrating a method 1000 for operating a PLL. For example, the method 1000 may represent the operation of the above-described PLL 600 FIGS. 6-7). As indicated by block 1002, a PFD may produce an output corresponding to a phase error between a reference clock signal and a feedback signal. As indicated by block 1004, a PI-based sampler may produce a slope signal in response to the PFD output. As described above with regard to the exemplary PLL 600, the slope signal may be a differential signal comprising a negative slope signal and a positive slope signal that mirror each other. As indicated by block 1006, the PI-based sampler may adjust the slope signal in response to a quantization error correction indication. As indicated by block 1008, the PI-based sampler may sample the slope signal in response to an edge of the reference clock signal. As indicated by block 1010, the PLL may filter the sampled slope signal to produce a VCO frequency control signal. As indicated by block 1012, in response to the VCO frequency control signal a VCO may produce an output that is fed back to a fractional frequency divider circuit. As indicated by blocks 1014 and 1016, respectively, the fractional frequency divider circuit produces the above-referenced feedback signal and quantization error correction indication. Modulating the integer divisor in the fractional frequency divider circuit to achieve fractional division introduces quantization error. The PI-based sampler may apply the quantization error correction indication to adjust the slope signal in a manner intended to cancel the quantization error.

Figure 11:
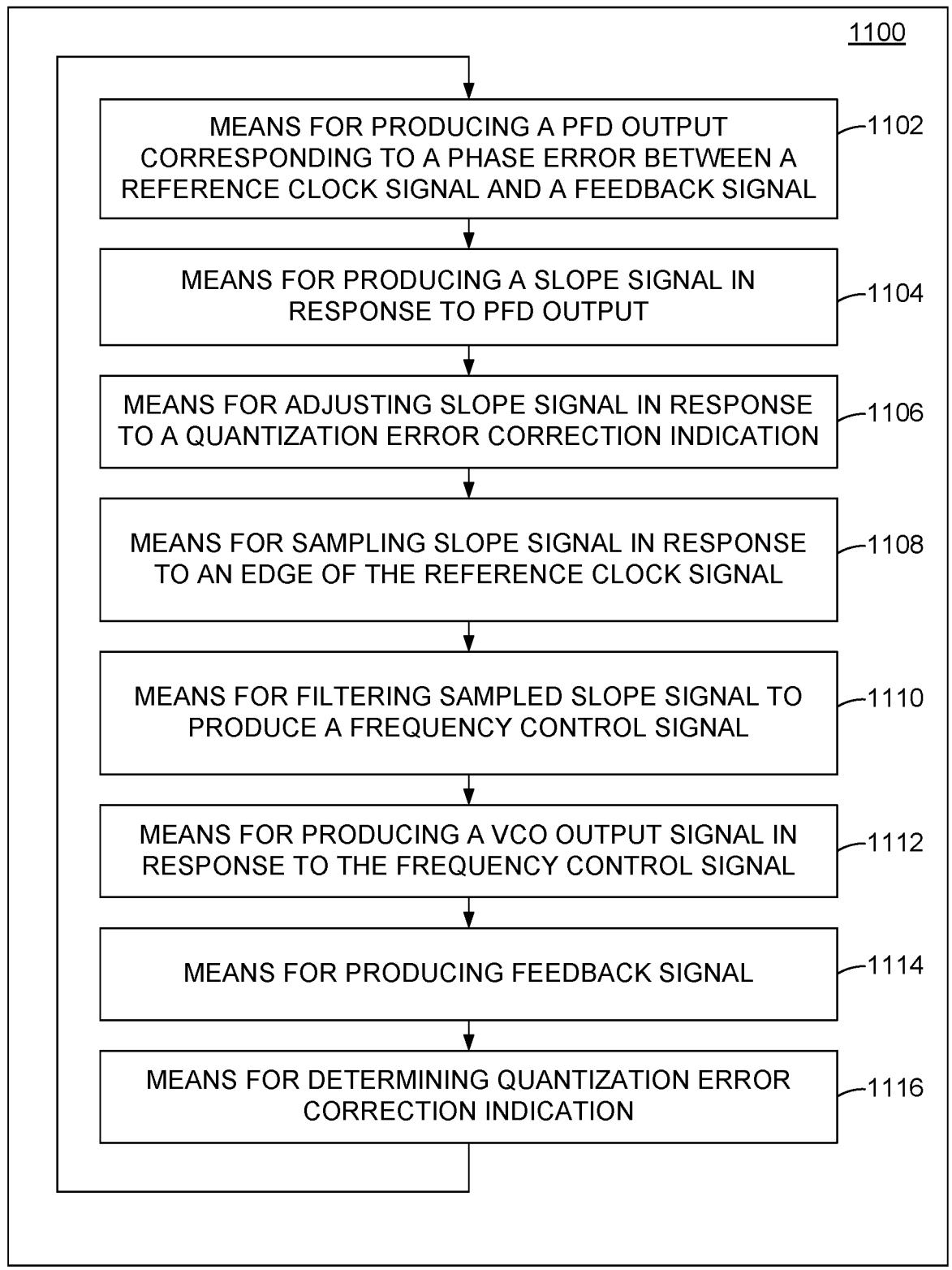
FIG. 11 is a functional block diagram of a PLL apparatus, in accordance with various aspects of the present disclosure.

FIG. 11 illustrates an apparatus 1100. The apparatus 1100 may include a means 1102 for producing an signal corresponding to a phase error between a reference clock signal and a feedback signal. The apparatus 1100 may include a means 1104 for producing a slope signal in response to the signal corresponding to a phase error. The apparatus 1100 may include a means 1106 for adjusting the slope signal in response to a quantization error correction indication. The apparatus 1100 may include a means 1108 for sampling the slope signal in response to an edge of the reference clock signal. The apparatus 1100 may include a means 1110 for filtering the sampled slope signal to produce a frequency control signal. The apparatus 1100 may include a means 1112 for producing a VCO output signal in response to the frequency control signal. The apparatus 1100 may include a means 1114 for producing the above-referenced feedback signal by fractional division of the VCO output signal. The apparatus 1100 may include a means 1116 for producing the above-referenced quantization error correction indication.

In the manner described above, a PLL in accordance with the present disclosure may provide benefits that include cancellation of quantization error introduced by modulation of an integer divisor to achieve fractional division in the PLL feedback loop. The PLL may be included in, for example, an RF receiver or transmitter. While certain exemplary PLL embodiments described herein may provide particular advantages with respect to RF receivers or transmitters, PLL implementations within the scope of the present disclosure are not limited to such exemplary embodiments. Configurations described herein may be used to implement PLLs in other contexts and having other benefits.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

The detailed description set forth above in connection with the appended drawings describes examples and does not represent the only examples that may be implemented or that are within the scope of the claims. The terms "example" and "exemplary," when used in this description, mean "serving as an example, instance, or illustration," and do not mean "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software in execution on a processor, firmware, or any combination thereof. If implemented in software in execution on a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Non-transitory computer-readable media include both computer storage media and communication media including any non-transitory medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. "Disk" and "disc," as used may be herein, include compact disc (CD), laser disc, optical disc, digital versatile disc (DVD), floppy disk, and Blu-ray disc, where disks usually reproduce data magnetically, while discs reproduce data optically with lasers. Combinations of the above are also included within the scope of non-transitory computer-readable media.

The foregoing disclosure is provided to enable a person skilled in the art to make or use the disclosed subject matter. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

Therefore, although selected aspects have been illustrated and described in detail, it will be understood that various substitutions and alterations may be made therein without departing from the spirit and scope of the present invention, as defined by the following claims.

What is claimed is:

1. A phase-locked loop (PLL), comprising:
    a phase-frequency detector (PFD) configured to produce a PFD output corresponding to a phase error between a reference clock signal and a feedback signal;
    a phase interpolation-based sampler configured to produce a slope signal in response to the PFD output, to adjust the slope signal in response to a quantization error correction indication, and to sample the slope signal;
    a loop filter circuit configured to produce a frequency control signal in response to a sampled slope signal produced by the phase interpolation-based sampler;
    a voltage-controlled oscillator (VCO) configured to produce a VCO output signal in response to the frequency control signal; and
    a fractional frequency divider circuit configured to divide a frequency of the VCO output signal to produce the feedback signal, and to determine the quantization error correction indication, wherein the quantization error correction indication is based on a quantization error introduced by fractional division of the frequency of the VCO output signal.

2. The PLL of claim 1, wherein the phase interpolation-based sampler is configured to set the slope signal to a first slope in response to an edge of the feedback signal and to set the slope signal to a second slope in response to an edge of a delayed feedback signal.

3. The PLL of claim 1, wherein the phase interpolation-based sampler comprises:
    a plurality (N) of resistance unit cells; and
    a capacitance circuit;
    wherein each resistance unit cell includes selection circuitry, the selection circuitry of the N resistance unit cells collectively configured to selectably couple in parallel with each other a number (m) of resistance unit cells of the N resistance unit cells and to couple the number (m) of resistance unit cells to the capacitance circuit, wherein the number (m) of resistance unit cells is based on the quantization error correction indication.

4. The PLL of claim 3, wherein the phase interpolation-based sampler is configured to couple the number (m) of resistance unit cells in parallel with each other in response to an edge of the feedback signal and to further couple the (m) resistance unit cells in parallel with a remaining number (N−m) of resistance unit cells in response to an edge of a delayed feedback signal.

5. The PLL of claim 4, wherein the phase interpolation-based sampler comprises a first capacitance coupled to a positive slope signal node and a second capacitance coupled to a negative slope signal node, and wherein each resistance unit cell comprises:
    a first portion comprising a first selector, a first resistance, and a first switching device, the first selector configured to respond to a code bit based on the quantization error correction indication by selecting one of a first signal based on the edge of the feedback signal and a second signal based on the edge of the delayed feedback signal, the first switching device configured to couple the first resistance between a power supply voltage and the positive slope signal node of the phase interpolation-based sampler in response to an output of the first selector; and a second portion comprising a second selector, a second resistance, and a second switching device, the second selector configured to respond to the code bit by selecting one of a third signal based on the edge of the feedback signal and a fourth signal based on the edge of the delayed feedback signal, the second switching device configured to couple the second resistance between a ground potential and the negative slope signal node of the phase interpolation-based sampler in response to an output of the second selector.

6. The PLL of claim 5, wherein:

the phase interpolation-based sampler is configured to sample a positive slope signal at the positive slope signal node to produce a positive sampled slope signal;

the phase interpolation-based sampler is configured to sample a negative slope signal at the negative slope signal node to produce a negative sampled slope signal; and the loop filter circuit includes a transconductance cell configured to operate in a linear region based on a difference between the positive sampled slope signal and the negative sampled slope signal.

7. The PLL of claim 4, wherein the fractional frequency divider circuit comprises a delta-sigma modulation circuit having a first delta-sigma modulator (DSM) configured to modulate an integer divisor of the fractional frequency divider circuit.

8. The PLL of claim 7, wherein the PFD includes a flip-flop circuit configured to produce the delayed feedback signal by applying a delay of an integer multiple of a period of the VCO output signal, wherein the integer multiple corresponds to an order of the first DSM.

9. The PLL of claim 8, wherein the fractional frequency divider circuit comprises:

an integer divider circuit configured to divide a frequency of the VCO output signal by an integer divisor to produce the feedback signal, wherein the first DSM is configured to modulate the integer divisor with a first DSM output value in response to a frequency control word;

a subtractor configured to determine a difference between the frequency control word and the first DSM output value;

an accumulator configured to integrate the difference between the frequency control word and the first DSM output value; and a second DSM configured to produce the quantization error correction indication in response to an output of the accumulator.

10. A phase-locked loop (PLL), comprising:

a phase-frequency detector (PFD) configured to produce a PFD output corresponding to a phase error between a reference clock signal and a feedback signal;

a phase interpolation-based sampler configured to produce a positive slope signal and a negative slope signal in response to the PFD output, the phase interpolation-based sampler further configured to set the positive and negative slope signals to a first slope in response to an edge of the feedback signal and to set the positive and negative slope signals to a second slope in response to an edge of a delayed feedback signal, the phase interpolation-based sampler further configured to determine the first slope in response to a quantization error correction indication, the phase interpolation-based sampler further configured to sample the positive slope signal to produce a positive sampled slope signal and to sample the negative slope signal to produce a negative sampled slope signal;

a transconductance cell configured to produce a current signal in response to a difference between the positive sampled slope signal and the negative sampled slope signal;

a filter configured to produce a frequency control signal in response to the current signal produced by the transconductance cell;

a voltage-controlled oscillator (VCO) configured to produce a VCO output signal in response to the frequency control signal; and a fractional frequency divider circuit configured to divide a frequency of the VCO output signal to produce the feedback signal, and to determine the quantization error correction indication, wherein the quantization error correction indication is based on a quantization error introduced by fractional division of the VCO output signal.

11. The PLL of claim 10, wherein the fractional frequency divider circuit comprises a delta-sigma modulation circuit having a first delta-sigma modulator (DSM) configured to modulate an integer divisor of the fractional frequency divider circuit.

12. The PLL of claim 11, wherein the PFD includes a flip-flop circuit configured to produce the delayed feedback signal by applying a delay of an integer multiple of a period of the VCO output signal, wherein the integer multiple corresponds to an order of the first DSM.

13. The PLL of claim 12, wherein the fractional frequency divider circuit comprises:

an integer divider circuit configured to divide a frequency of the VCO output signal by an integer divisor to produce the feedback signal, wherein the first DSM is configured to modulate the integer divisor with a first DSM output value in response to a frequency control word;

a subtractor configured to determine a difference between the frequency control word and the first DSM output value;

an accumulator configured to integrate the difference between the frequency control word and the first DSM output value; and a second DSM configured to produce the quantization error correction indication in response to an output of the accumulator.

14. The PLL of claim 10, wherein the phase interpolation-based sampler comprises a plurality (N) of resistance unit cells, each resistance unit cell including selection circuitry, the selection circuitry of the N resistance unit cells collectively configured to couple in parallel with each other a number (m) of resistance unit cells of the N resistance unit cells in response to the edge of the feedback signal and to further couple a remaining number (N−m) of resistance unit cells in parallel with the (m) resistance unit cells response to the edge of the delayed feedback signal, wherein the number (m) of resistance unit cells is based on the quantization error correction indication.

15. The PLL of claim 14, wherein the phase interpolation-based sampler comprises a first capacitance coupled to a positive slope signal node and a second capacitance coupled to a negative slope signal node, and wherein each resistance unit cell comprises:

a first selector, a first resistance, and a first switching device, the first selector configured to respond to a code bit based on the quantization error correction indication by selecting one of a first signal based on the edge of the feedback signal and a second signal based on the edge of the delayed feedback signal, the first switching device configured to couple the first resistance between a power supply voltage and the positive slope signal node of the phase interpolation-based sampler in response to an output of the first selector; and a second selector, a second resistance, and a second switching device, the second selector configured to respond to the code bit by selecting one of a third signal based on the edge of the feedback signal and a fourth signal based on the delayed edge of the feedback signal, the second switching device configured to couple the second resistance between a ground potential and the positive slope signal node of the phase interpolation-based sampler in response to an output of the second selector.

16. The PLL of claim 15, wherein:
the phase interpolation-based sampler is configured to sample a positive slope signal at the positive slope signal node to produce a positive sampled slope signal; and
the phase interpolation-based sampler is configured to sample a negative slope signal at the negative slope signal node to produce a negative sampled slope signal.

17. A method for operating a phase-locked loop (PLL), comprising:
producing, by a phase-frequency detector (PFD), a PFD output corresponding to a phase error between a reference clock signal and a feedback signal;
producing, by a phase interpolation-based sampler, a slope signal in response to the PFD output;
adjusting, by the phase interpolation-based sampler, the slope signal in response to a quantization error correction indication;
sampling the slope signal by the phase interpolation-based sampler;
filtering a sampled slope signal produced by the phase interpolation-based sampler to produce a frequency control signal;
producing, by a voltage-controlled oscillator (VCO), a VCO output signal in response to the frequency control signal;
producing the feedback signal by a fractional frequency divider circuit dividing a frequency of the VCO output signal; and
determining, by the fractional frequency divider circuit, the quantization error correction indication, wherein the quantization error correction indication is based on a quantization error introduced by fractional division of the VCO output signal.

18. The method of claim 17, further comprising producing a delayed feedback signal in response the feedback signal, and wherein adjusting the slope signal comprises setting the slope signal to a first slope in response to an edge of the feedback signal, and setting the slope signal to a second slope in response to an edge of the delayed feedback signal.

19. The method of claim 18, wherein h adjusting the slope signal comprises coupling in parallel with each other a number (m) of resistance unit cells out of a total number (N) of resistance unit cells, wherein the number (m) of resistance unit cells are coupled to a capacitance circuit, and wherein the number (m) of resistance unit cells is selected based on the quantization error correction indication.

20. The method of claim 19, wherein the adjusting the slope signal comprises:

coupling the number (m) of resistance unit cells in parallel with each other in response to the edge of the feedback signal; and
coupling the (m) resistance unit cells in parallel with a remaining number (N–m) of resistance unit cells in response to the edge of the delayed feedback signal.

21. The method of claim 20, wherein the dividing the frequency of the VCO output signal comprises modulating, by a first delta-sigma modulator (DSM), an integer divisor of the fractional frequency divider circuit.

22. The method of claim 21, wherein the producing the delayed feedback signal comprises applying a delay of an integer multiple of a period of the VCO output signal, wherein the integer multiple corresponds to an order of the first DSM.

23. The method of claim 22, wherein:
the producing the feedback signal comprises dividing, by an integer divider circuit, the frequency of the VCO output signal by an integer divisor, and modulating, by the first DSM, the integer divisor in response to a frequency control word; and
the determining the quantization error correction indication comprises:
determining a difference between the frequency control word and a DSM output value provided by the first DSM to modulate the integer divisor;
integrating the difference between the frequency control word and the DSM output value; and
producing, by a second DSM, the quantization error correction indication in response to a result of integrating the difference.

24. A phase-locked loop (PLL) apparatus, comprising:
means for producing a phase-frequency detection output corresponding to a phase error between a reference clock signal and a feedback signal;
means for producing a slope signal in response to the phase-frequency detection output;
means for adjusting the slope signal in response to a quantization error correction indication;
means for sampling the slope signal;
means for filtering a sampled slope signal to produce a frequency control signal;
means for producing a voltage-controlled oscillator (VCO) output signal in response to the frequency control signal;
means for fractionally dividing a frequency of the VCO output signal to produce the feedback signal; and
means for determining the quantization error correction indication, wherein the quantization error correction indication is based on a quantization error introduced by the means for fractionally dividing.

25. The PLL apparatus of claim 24, further comprising means for producing a delayed feedback signal in response the feedback signal, and wherein the means for adjusting the slope signal comprises means for setting the slope signal to a first slope in response to an edge of the feedback signal, and means for setting the slope signal to a second slope in response to an edge of the delayed feedback signal.

26. The PLL apparatus of claim 25, wherein the means for adjusting the slope signal comprises means for coupling in parallel with each other a number (m) of resistance unit cells out of a total number (N) of resistance unit cells, wherein the number (m) of resistance unit cells are coupled to a capacitance circuit, and wherein the means for adjusting the slope signal selects the number (m) of resistance unit cells based on the quantization error correction indication.

27. The PLL apparatus of claim 26, wherein the means for adjusting the slope signal comprises:
- means for coupling the number (m) of resistance unit cells in parallel with each other in response to the edge of the feedback signal; and
- means for coupling the (m) resistance unit cells in parallel with a remaining number (N−m) of resistance unit cells in response to the edge of the delayed feedback signal.

28. The PLL apparatus of claim 27, wherein the means for dividing the frequency of the VCO output signal comprises means for modulating an integer divisor of the fractional frequency divider circuit.

29. The PLL apparatus of claim 28, wherein the means for producing the delayed feedback signal comprises means for applying a delay of an integer multiple of a period of the VCO output signal, wherein the integer multiple corresponds to an order of a delta-sigma modulator (DSM).

30. The PLL apparatus of claim 29, wherein:
the means for producing the feedback signal comprises means for dividing the frequency of the VCO output signal by an integer divisor, and means for modulating the integer divisor in response to a frequency control word; and
the means for determining the quantization error correction indication comprises:
means for determining a difference between the frequency control word and an output value provided by the means for modulating the integer divisor;
means for integrating the difference between the frequency control word and the output value; and
means for producing the quantization error correction indication in response to a result of integrating the difference.

* * * * *